(12) United States Patent
Ichikawa et al.

(10) Patent No.: US 11,968,861 B2
(45) Date of Patent: Apr. 23, 2024

(54) DISPLAY DEVICE AND METHOD FOR MANUFACTURING SAME

(71) Applicant: SHARP KABUSHIKI KAISHA, Sakai (JP)

(72) Inventors: Shinji Ichikawa, Sakai (JP); Shinsuke Saida, Sakai (JP); Ryosuke Gunji, Sakai (JP); Hiroki Taniyama, Sakai (JP); Tohru Okabe, Sakai (JP); Akira Inoue, Sakai (JP); Hiroharu Jinmura, Sakai (JP); Yoshihiro Nakada, Sakai (JP); Koji Tanimura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 456 days.

(21) Appl. No.: 17/599,885

(22) PCT Filed: Apr. 4, 2019

(86) PCT No.: PCT/JP2019/015016
§ 371 (c)(1),
(2) Date: Sep. 29, 2021

(87) PCT Pub. No.: WO2020/202539
PCT Pub. Date: Oct. 8, 2020

(65) Prior Publication Data
US 2022/0165823 A1 May 26, 2022

(51) Int. Cl.
*H10K 71/00* (2023.01)
*H10K 59/124* (2023.01)
*H10K 59/12* (2023.01)
*H10K 59/131* (2023.01)
*H10K 77/10* (2023.01)
*H10K 102/00* (2023.01)

(52) U.S. Cl.
CPC .......... *H10K 59/124* (2023.02); *H10K 71/00* (2023.02); *H10K 59/1201* (2023.02); *H10K 59/131* (2023.02); *H10K 77/111* (2023.02); *H10K 2102/311* (2023.02)

(58) Field of Classification Search
CPC ............................. H10K 71/00; H10K 59/124
See application file for complete search history.

(56) References Cited

U.S. PATENT DOCUMENTS

| 9,356,087 B1 * | 5/2016 | Lee ................. H01L 27/124 |
| 2016/0155788 A1 * | 6/2016 | Kwon ............... H10K 59/131 |
| | | 257/40 |
| 2018/0047802 A1 | 2/2018 | Yoon et al. |

(Continued)

FOREIGN PATENT DOCUMENTS

| JP | 2018-113104 A | 7/2018 |
| WO | 2019/026285 A1 | 2/2019 |

*Primary Examiner* — Douglas M Menz
(74) *Attorney, Agent, or Firm* — ScienBiziP, P.C.

(57) ABSTRACT

An organic EL display (1) has a bend (B) where a slit (81) is bored in a base coat film (23), gate insulating film (27), first interlayer insulating film (31) and second interlayer insulating film (35). The bend is provided with a filler layer (83) filling the slit and covering both edges of the slit. The filler layer has a protrusion (85) overlapping each edge in the width direction of the slit. A routed wire (7) routed from the display region (D) and then routed over the filler layer to reach a terminal section (T) extends over the protrusion.

10 Claims, 15 Drawing Sheets

(56) References Cited

U.S. PATENT DOCUMENTS

| | | |
|---|---|---|
| 2019/0019966 A1 | 1/2019 | Jiang et al. |
| 2019/0326549 A1 | 10/2019 | Kokame et al. |
| 2019/0372034 A1 | 12/2019 | Kaneko et al. |
| 2020/0219423 A1* | 7/2020 | Okabe .................. H10K 50/814 |

* cited by examiner

ABSTRACT

DISPLAY DEVICE AND METHOD FOR MANUFACTURING SAME

TECHNICAL FIELD

The present disclosure relates to a display device and a method for manufacturing the same.

BACKGROUND ART

Attention has been recently drawn to self-luminous organic EL displays using organic electroluminescence (hereinafter referred to as EL) elements, as display devices instead of liquid-crystal displays. Among these organic EL displays, flexible organic EL displays have been proposed that have a flexible resin substrate provided with organic EL elements.

An organic EL display has a display region for image display, and a frame region around the display region. Such an organic EL display is required to reduce its frame region. A flexible organic EL display has a frame region that is bent in its terminal section, in order to reduce the occupying area of the frame region in a plan view.

Such an organic EL display includes an inorganic insulating film, which in some cases is removed from the bend in the frame region in order to reduce a bending stress that is exerted on the bend. This removed site, which constitutes a slit, is filled with a resin filler layer covering both edges of the slit, in order to avoid a wire, routed from the display region through the bend to the terminal section, from breakage at both edges of the slit of the inorganic insulating film (c.f., Patent Literature 1).

CITATION LIST

Patent Literature

Patent Literature 1: Japanese Patent Application Laid-Open No. 2018-113104

SUMMARY OF INVENTION

Technical Problem

The above filler layer is formed by applying photosensitive resin to form a resin layer, followed by patterning the resin layer through photolithography. The filler layer, which undergoes baking, hence tends to become thin at a portion covering the slit edges of the inorganic insulating film, thus possibly failing to cover the slit edges of the inorganic insulating film. If the edges of the inorganic insulating film is exposed from the filler layer, the routed wire still possibly breaks at the bend.

It is an object of the technique of the present disclosure to avoid a routed wire from breakage at a bend.

Solution to Problem

The technique of the present disclosure is directed to a display device that includes the following: a resin substrate having flexibility; an inorganic insulating film disposed on the resin substrate; a flattening film disposed on the inorganic insulating film; and a first wire disposed on the flattening film.

The display device according to the technique of the present disclosure includes a terminal section and a bend both disposed in a frame region located around a display region. The terminal section is provided for connection with an external circuit. The bend is bent, between the display region and terminal section, around an axis extending in a first direction. The display region is provided for image display. The inorganic insulating film has a slit extending in the first direction at the bend.

The bend is provided with a filler layer filling the slit of the inorganic insulating film and covering both of edges in the width direction of the slit. The first wire includes a plurality of routed wires routed, in a second direction, from the display region and then routed over the filler layer to reach the terminal section. The second direction intersects with the first direction. The filler layer has a protrusion overlapping each of the edges in the width direction of the slit. The plurality of routed wires extend over the protrusion.

The thickness from a surface of the resin substrate to the upper surface of the protrusion is greater than the thickness from the surface of the resin substrate to the upper surface of the inorganic insulating film that is in contact with the filler layer outside the slit. The thickness from the surface of the resin substrate to the upper surface of the inorganic insulating film that is in contact with the filler layer outside the slit is greater than the thickness from the surface of the resin substrate to the upper surface of the filler layer located inside the slit.

Advantageous Effect

The display device according to the technique of the present disclosure, which includes the filler layer having a protrusion overlapping each edge in the width direction of the slit and includes the routed wires extending over the protrusion, can cover the slit edge of the inorganic insulating film with certainty even when the filler layer is thin at a location where the layer covers the slit edge of the inorganic insulating film. This can avoid the routed wires from breakage at the bend.

DESCRIPTION OF EMBODIMENT

An illustrative embodiment will be detailed with reference to the drawings. The following embodiment describes an organic EL display that includes organic EL elements, as an example of the display device according to the technique of the present disclosure.

In the following embodiment, one component, such as a film, a layer or an element, disposed or provided on another component, such as a film, a layer or an element, refers not only to one component disposed directly on another component, but also to one component, such as a film, a layer or an element, interposed between such other components.

In the following embodiment, one component, such as a film, a layer or an element, connected to another component, such as a film, a layer or an element refers to electrical connection between these components unless otherwise specified, and within a scope not departing from the purport of the technique of the present disclosure, such inter-component connection refers not only to direct connection between the components, but also to indirect connection between the components with another component, such as a film, a layer or an element, interposed therebetween. In addition, such inter-component connection can also refer to one component integrated with another component, that is, part of one component constituting another component.

In the following embodiment, the term "in the same layer" refers to that one layer is formed in the same process step as a comparative film or layer, the term "in a lower position than" refers to that one layer is formed in a process step anterior to a process step of forming a comparative film, layer or element, and the term "in a higher position" refers to that one layer is formed in a process step posterior to a process step of forming a comparative film or layer.

Embodiment

Figure 1:
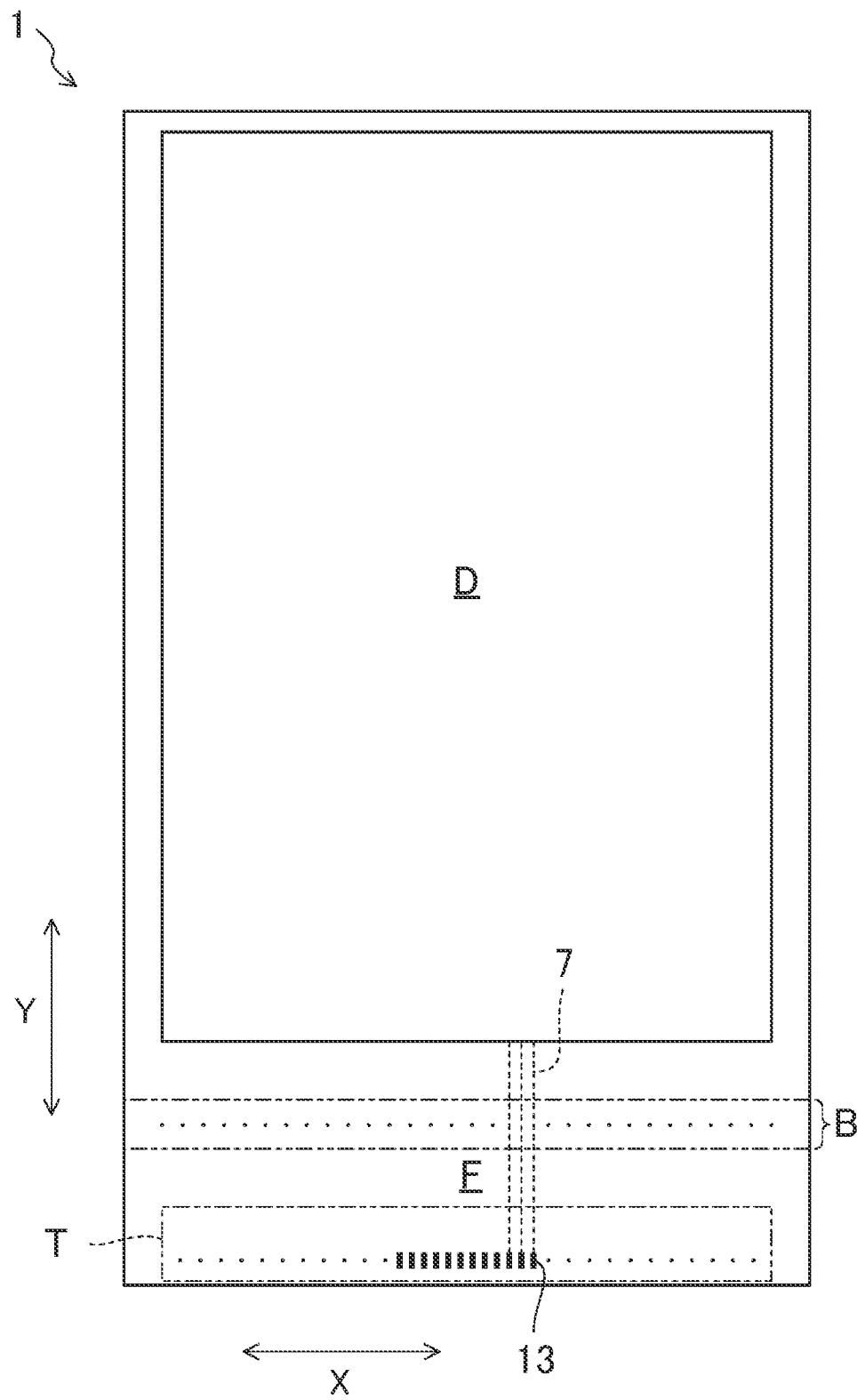
FIG. 1 is a schematic plan view of the configuration of an organic EL display according to an embodiment.
Figure 2:
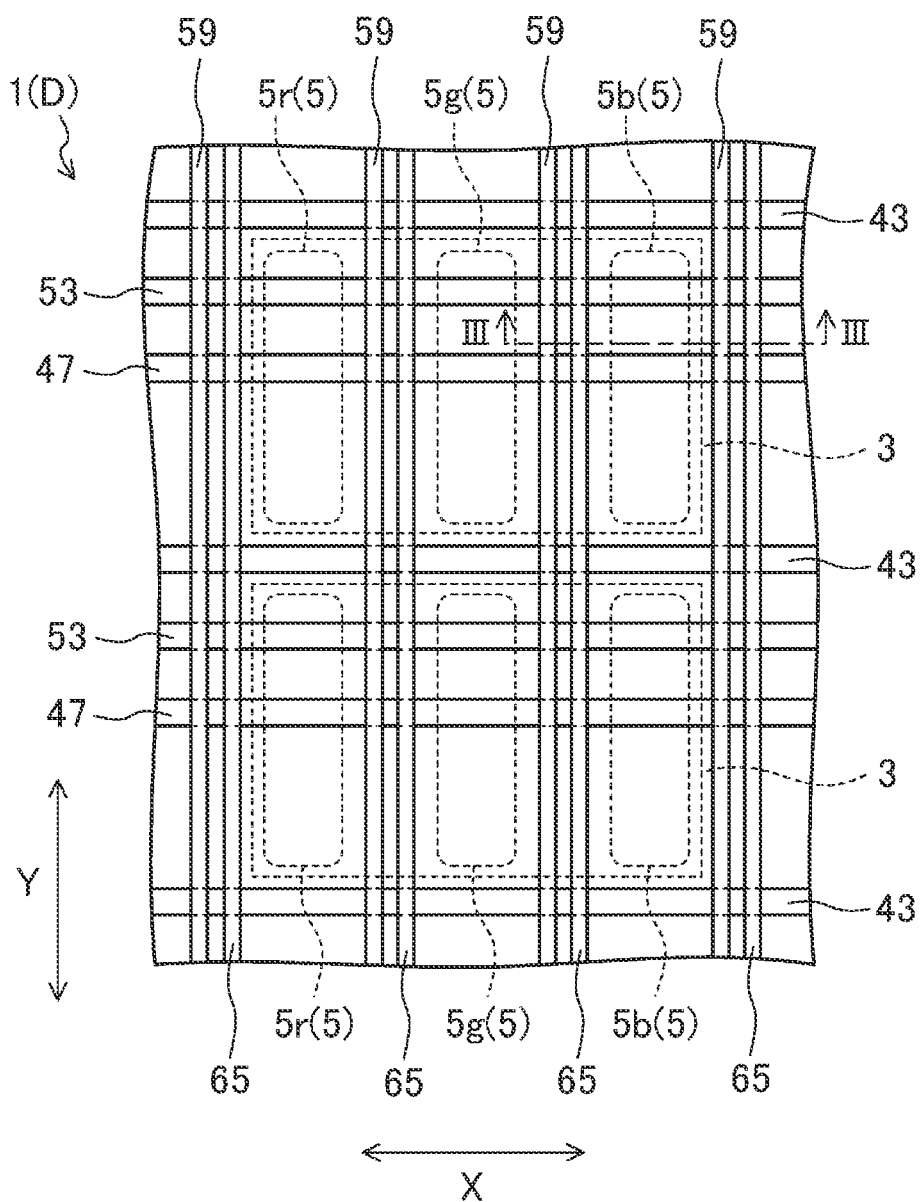
FIG. 2 is a plan view of the configuration of a display region of the organic EL display according to the embodiment.
Figure 3:
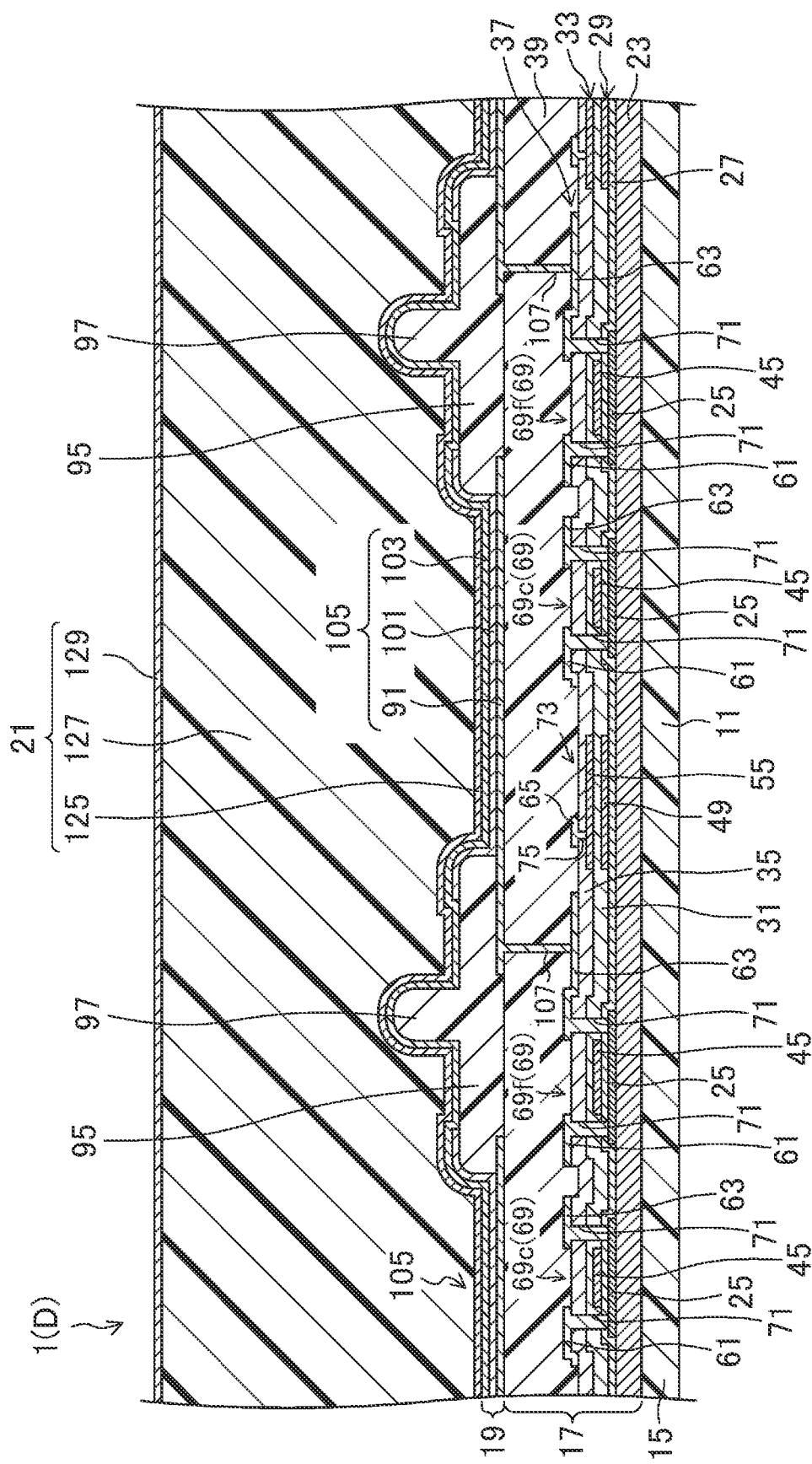
FIG. 3 is a sectional view of the organic EL display taken along line III-III in FIG. 2.
Figure 4:
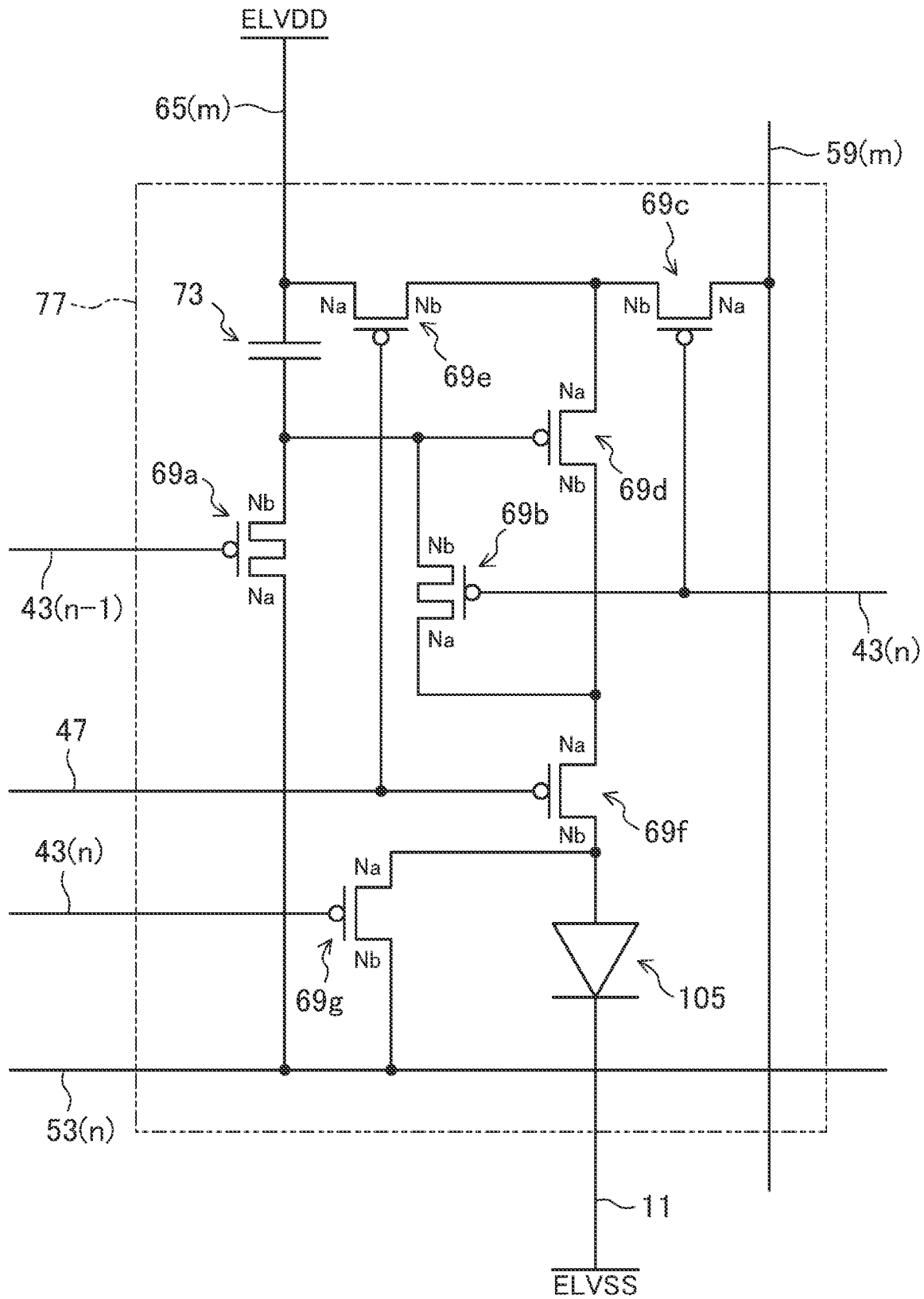
FIG. 4 is an equivalent circuit diagram illustrating a pixel circuit of the organic EL display according to the embodiment.
Figure 5:
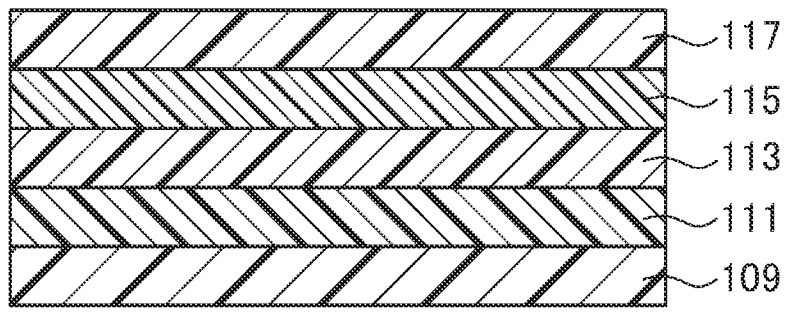
FIG. 5 is a sectional view of the stacked structure of an organic EL layer, which forms the organic EL display according to the embodiment.

FIGS. 1 to 7 illustrate an example embodiment of a display device according to the technique of the present disclosure. FIG. 1 is a schematic plan view of the configuration of an organic EL display 1 according to this embodiment. FIG. 2 is a plan view of the configuration of a display region D of the organic EL display 1. FIG. 3 is a sectional view of the organic EL display 1 taken along line III-III in FIG. 2. FIG. 4 is an equivalent circuit diagram illustrating a pixel circuit 77 of the organic EL display 1. FIG. 5 is a sectional view of the stacked structure of an organic EL layer 101, which forms the organic EL display 1.

Configuration of Organic EL Display

As illustrated in FIG. 1, the organic EL display 1 has the display region D provided for image display, and a frame region F disposed around the display region D.

The display region D is a rectangular region constituting a screen. The display region D is composed of a plurality of pixels 3, as illustrated in FIG. 2. These pixels 3 are arranged in matrix for instance. Each pixel 3 includes three sub-pixels 5 for instance: a sub-pixel 5r that emits red light, a sub-pixel 5g that emits green light, and a sub-pixel 5b that emits blue light. These three sub-pixels 5 are arranged in a stripe manner for instance.

The display region D in this embodiment is rectangular; a rectangular shape herein includes substantial rectangles, including a rectangle with an arc-shaped side, a rectangle with an arc-shaped corner, and a rectangle with a side partly having a cut.

The frame region F is a rectangular-frame-shaped region constituting a non-display part except the screen. The frame region F has one side provided with a terminal section T, which is used for connection to an external circuit, as illustrated in FIG. 1. The frame region F has a bend B disposed between the display region D and terminal section T and being bendable about an axis extending in a first direction X, which is the horizontal direction in FIG. 1.

The terminal section T is disposed on the backside of the organic EL display 1 when the frame region F is 1800 (U-shape) bent for instance at the bend B. The terminal section T is connected to a wiring substrate, such as a flexible printed circuit (FPC). The frame region F includes a plurality of routed wires 7 routed from the display region D to the terminal section T.

The frame region F includes drive circuits (not shown), including a gate driver, an emission driver and other drivers, disposed in a monolithic manner on sides (the right and left sides in FIG. 1) adjacent to the side where the terminal section T is disposed. The frame region F also includes a low-level power-source wire (not shown). The low-level power-source wire is routed toward the terminal section T as well, to constitute the routed wires 7.

The terminal section T includes a plurality of wire terminals 13 provided in a predetermined pattern, in order to establish electrical conduction with the routed wires 7 disposed in the frame region F. The organic EL display 1 is connected to a high-level-voltage power source (ELVDD), a low-level-voltage power source (ELVSS) and a display control circuit by the wire terminals 13 via the wiring substrate.

The organic EL display 1 uses thin-film transistors (hereinafter referred to as TFTs) 69 to control light emission in the individual sub-pixels 5. The organic EL display 1 also uses active-matrix drive, where image display is performed by the operation of the TFTs 69. As illustrated in FIG. 3, the organic EL display 1 includes a resin substrate layer 15, a TFT layer 17 disposed on the resin substrate layer 15, a light emitter layer 19 disposed on the TFT layer 17, and a sealing film 21 disposed on the light emitter layer 19.

Configuration of Resin Substrate Layer

The resin substrate layer 15 is an example resin substrate and is flexible. The resin substrate layer 15 is made of an organic material, including polyimide resin, polyamide resin and epoxy resin. The resin substrate layer 15 may be composed of a stack of the foregoing resin layer and an inorganic insulating layer made of an inorganic material, including silicon oxide (SiOx), silicon nitride (SiNy), and silicon oxide nitride (SiOxNy, where x and y are positive numbers; this holds true for the following description).

Configuration of TFT Layer

The TFT layer 17 includes, in sequence on the resin substrate layer 15, a base coat film 23, a semiconductor layer 25, a gate insulating film 27, a first conductive layer 29, a first interlayer insulating film 31, a second conductive layer 33, a second interlayer insulating film 35, a third conductive layer 37, and a flattening film 39. The base coat film 23, the gate insulating film 27, the first interlayer insulating film 31, and the second interlayer insulating film 35 constitute an inorganic insulating film disposed on the resin substrate layer 15.

The first conductive layer 29 includes a plurality of gate wires 43, a plurality of gate electrodes 45, a plurality of emission control wires 47, a plurality of first capacitive electrodes 49, and a plurality of second routed wires 7b. The gate wires 43, the gate electrodes 45, the emission control wires 47, the first capacitive electrodes 49, and the second routed wires 7b are made of the same material and formed in the same layer.

The gate wires 43, the gate electrodes 45, the emission control wires 47, the first capacitive electrodes 49, and the second routed wires 7b are composed of a monolayer film of metal, including aluminum (Al), tungsten (W), molybdenum (Mo), tantalum (Ta), chromium (Cr), titanium (Ti), and copper (Cu), or these components are composed of a laminated layer of these metals. The gate wires 43, the emission control wires 47, and the second routed wires 7b are an example of a second wire disposed on the resin substrate layer 15 and located in a lower position than the inorganic insulating film, such as the gate insulating film 27.

The second conductive layer 33 includes a plurality of initialization power-source wires 53 and a plurality of second capacitive electrodes 55. The initialization power-source wires 53 and the second capacitive electrodes 55 are made of the same material and formed in the same layer. The initialization power-source wires 53 and the second capacitive electrodes 55 are composed of a monolayer film of metal, including aluminum (Al), tungsten (W), molybdenum (Mo), tantalum (Ta), chromium (Cr), titanium (Ti), and copper (Cu), or these components are composed of a laminated layer of these metals.

The third conductive layer 37 includes a plurality of source wires 59, a plurality of source electrodes 61, a plurality of drain electrodes 63, a plurality of high-level power-source wires 65, a low-level power-source wire, and a plurality of first routed wires 7a. The source wires 59, the source electrodes 61, the drain electrodes 63, the high-level power-source wires 65, the low-level power-source wire, and the first routed wires 7a are made of the same material and formed in the same layer.

The source wires 59, the source electrodes 61, the drain electrodes 63, the high-level power-source wires 65, the low-level power-source wire, and the first routed wires 7a are composed of a monolayer film of metal, including aluminum (Al), tungsten (W), molybdenum (Mo), tantalum (Ta), chromium (Cr), titanium (Ti), and copper (Cu), or these components are composed of a laminated layer of these metals. The source wires 59, the high-level power-source wires 65, the low-level power-source wire, and the first routed wires 7a are an example of a first wire disposed on the inorganic insulating film, such as the second interlayer insulating film 35.

The gate wires 43 extend in parallel to each other in the first direction X, as illustrated in FIG. 2. The gate wire 43 transmits a gate signal and is provided for each row of the sub-pixels 5. The individual gate wires 43 are connected to the gate driver, included in the drive circuit, and are selected sequentially at a predetermined timing to be activated.

The emission control wires 47 extend in parallel to each other in the first direction X. The emission control wire 47 transmits an emission control signal and is provided for each row of the sub-pixels 5. The individual emission control wires 47 are connected to the emission driver, included in the drive circuit, and are selected sequentially at a predetermined timing to be inactivated.

The initialization power-source wires 53 extend in parallel to each other in the first direction X. The initialization power-source wire 53 supplies an initialization potential and is provided for each row of the sub-pixels 5. The individual initialization power-source wires 53, which are the routed wires 7, are routed from the display region D to the terminal section T and are connected to an initialization-voltage power source in the terminal section T via the wiring substrate.

The source wires 59 extend in parallel to each other in a second direction Y, which is the vertical direction in FIG. 1, orthogonal to the first direction X. The source wire 59 transmits a source signal and is provided for each column of the sub-pixels 5. The individual source wires 59, which are the routed wires 7, are routed from the display region D to the terminal section T and are connected to the display control circuit in the terminal section T via the wiring substrate.

The high-level power-source wires 65 extend in parallel to each other in the second direction Y. The high-level power-source wire 65 supplies a predetermined high-level potential and is provided for each column of the sub-pixels 5. The individual high-level power-source wires 65, which are the routed wires 7, are routed from the display region D to the terminal section T and are connected to the high-level-voltage power source (ELVDD) in the terminal section T via the wiring substrate.

Although not shown, the low-level power-source wire extends in the frame region F so as to surround the display region D. The low-level power-source wire supplies a predetermined low-level potential and is shared among the plurality of sub-pixels 5. The low-level power-source wire, which is the routed wire 7, is routed from the display region D to the terminal section T and is connected to the low-level-voltage power source (ELVSS) in the terminal section T via the wiring substrate.

The first routed wires 7a and the second routed wires 7b each extend toward the terminal section T in the frame region F. Each first routed wire 7a and each second routed wire 7b are connected together to constitute the routed wire 7 (c.f., FIGS. 6 and 7).

The semiconductor layer 25, the gate insulating film 27, the gate electrode 45, the first interlayer insulating film 31, the second interlayer insulating film 35, the source electrode 61, and the drain electrode 63 constitute the TFTs 69.

The semiconductor layer 25 is provided in the form of islands. The semiconductor layer is made of an oxide semiconductor, such as low-temperature polycrystalline silicon (LTPS) or In—Ga—Zn—O semiconductor.

The gate insulating film 27 covers the semiconductor layer 25. The gate insulating film 27 is composed of an inorganic insulating monolayer film of, for instance, silicon oxide (SiOx), silicon nitride (SiNy) or silicon oxide nitride (SiOxNy), or the gate insulating film 27 is composed of an inorganic insulating laminated film of these materials.

The gate electrode 45 overlaps part of the semiconductor layer 25 (channel region) with the gate insulating film 27 interposed therebetween. The gate electrode 45 is connected to the gate wire 43 of the corresponding sub-pixel 5.

The first interlayer insulating film 31 covers the gate wires 43, the gate electrodes 45, the emission control wires 47, and the first capacitive electrodes 49. The second interlayer insulating film 35 covers, on the first interlayer insulating film 31, the initialization power-source wires 53 and the second capacitive electrodes 55. Each of the first interlayer insulating film 31 and second interlayer insulating film 35 is composed of an inorganic insulating monolayer film of, for instance, silicon oxide (SiOx), silicon nitride (SiNy) or silicon oxide nitride (SiOxNy), or each of these films is composed of an inorganic insulating laminated film of these materials.

The source electrodes 61 are separate from the drain electrodes 63. Each source electrode 61 and each drain electrode 63 are individually connected to different parts (source and drain regions) of the semiconductor layer 25 sandwiching the region where the semiconductor layer 25 overlaps the gate electrode 45, via contact holes 71 bored in the gate insulating film 27, first interlayer insulating film 31 and second interlayer insulating film 35. Each gate electrode 61 is connected to the source wire 59 of the corresponding sub-pixel 5.

The plurality of TFTs 69 are provided for each sub-pixel 5. That is, the TFT layer 17 includes the plurality of TFTs 69.

The TFTs 69 in each sub-pixel 5 includes a first TFT 69a, a second TFT 69b, a third TFT 69c, a fourth TFT 69d, a fifth TFT 69e, a sixth TFT 69f, and a seventh TFT 69g. All the first to seventh TFTs 69a, 69b, 69c, 69d, 69e, 69f, and 69g are top-gate TFTs, as described earlier; for instance, they are P-channel TFTs.

Each first capacitive electrode 49, the first interlayer insulating film 31, and each second capacitive electrode 55 constitute a capacitor 73. At least one capacitor 73 is provided for each sub-pixel 5.

The first capacitive electrode 49 is connected to three of the TFTs 69 (i.e., the first TFT 69a, the second TFT 69b, and the fourth TFT 69d) disposed in the sub-pixel 5. The second capacitive electrode 55 overlaps the first capacitive electrode 49 with the first interlayer insulating film 31 interposed therebetween. The second capacitive electrode 55 is connected to the high-level power-source wire 65 via a contact hole 75 bored in the second interlayer insulating film 35.

The first TFT 69a, the second TFT 69b, the third TFT 69c, the fourth TFT 69d, the fifth TFT 69e, the sixth TFT 69f, the seventh TFT 69g and the capacitor 73 constitute a pixel circuit 77 illustrated in FIG. 4. In the first to seventh TFTs 69a, 69b, 69c, 69d, 69e, 69f and 69g, the gate electrode 45 corresponds to a control terminal; in addition, one of the source electrode 61 and drain electrode 63 corresponds to a first conduction terminal Na, and the other electrode corresponds to a second conduction terminal Nb.

The pixel circuit 77 in FIG. 4 is located in the m$^{th}$ row and n$^{th}$ column (m and n are positive integers). The source wire 59 and high-level power-source wire 65 both denoted by a reference sign "m" in FIG. 4 correspond to the sub-pixel 5 located in the m$^{th}$ row. In addition, the gate wire 43, emission control wire 47 and initialization power-source wire 53 all denoted by a reference sign "n" in the drawing correspond to the sub-pixel 5 located in the n$^{th}$ column. In addition, the gate wire 43 denoted by a reference sign "n−1" in the drawing is the gate wire 43 that undergoes scanning immediately before the gate wire 43 located in the n$^{th}$ column.

The first TFT 69a is a first initialization TFT disposed between the gate wire 43, initialization power-source wire 53 and capacitor 73. The first TFT 69a is connected to the gate wire 43, moreover, its first conduction terminal Na is connected to the initialization power-source wire 53, and its second conduction terminal Nb is connected to the first capacitive electrode 49 of the capacitor 73. The gate wire 43 to which the control terminal of the first TFT 69a is connected undergoes scanning immediately before the gate wire 43 of the corresponding sub-pixel 5. The first TFT 69a is designed to apply a voltage from the initialization power-source wire 53 to the capacitor 73 in accordance with the selection of the gate wire 43, to initialize a voltage applied to the control terminal of the fourth TFT 69d.

The second TFT 69b is disposed between the gate wire 43 and fourth TFT 69d and is used for threshold compensation. The control terminal of the second TFT 69b is connected to the gate wire 43, the first conduction terminal Na of the same is connected to the second conduction terminal Nb of the fourth TFT 69d, and the second conduction terminal Nb of the same is connected to the control terminal of the fourth TFT 69d. The second TFT 69b is designed to bring the fourth TFT 69d into diode connection in accordance with the selection of the gate wire 43 to compensate for a threshold voltage of the fourth TFT 69d.

The third TFT 69c is disposed between the gate wire 43, source wire 59 and fourth TFT 69d and is used for writing. The control terminal of the third TFT 69c is connected to the gate wire 43, the first conduction terminal Na of the same is connected to the source wire 59, and the second conduction terminal Nb of the same is connected to the first conduction terminal Na of the fourth TFT 69d. The third TFT 69c is designed to apply a voltage from the source wire 59 to the first conduction terminal Na of the fourth TFT 69d in accordance with the selection of the gate wire 43.

The fourth TFT 69d is disposed between the first TFT 69a, second TFT 69b, capacitor 73, third TFT 69c, fifth TFT 69e and sixth TFT 69f and is used for driving. The control terminal of the fourth TFT 69d is connected to the second conduction terminal Nb of the second TFT 69b and to the first capacitive electrode 49 of the capacitor 73. The first conduction terminal Na of the fourth TFT 69d is connected to the second conduction terminal Nb of the third TFT 69c and to the second conduction terminal Nb of the fifth TFT 69e. The second conduction terminal Nb of the fourth TFT 69d is connected to the first conduction terminal Na of the second TFT 69b and to the first conduction terminal Na of the sixth TFT 69f. The fourth TFT 69d is designed to apply, to the first conduction terminal Na of the sixth TFT 69f, a drive current based on a voltage applied between its control terminal and first conduction terminal Na.

The fifth TFT 69e is disposed between the emission control wire 47, high-level power-source wire 65 and fourth TFT 69d and is used for power supply. The control terminal of the fifth TFT 69e is connected to the emission control wire 47, the first conduction terminal Na of the same is connected to the high-level power-source wire 65, and the second conduction terminal Nb of the same is connected to the first conduction terminal Na of the fourth TFT 69d. The fifth TFT 69e is designed to apply a potential from the high-level power-source wire 65 to the first conduction terminal Na of the fourth TFT 69d in accordance with the selection of the emission control wire 47.

The sixth TFT 69f is disposed between the emission control wire 47, second TFT 69b, fourth TFT 69d and an organic EL element 105 and is used for light emission control. The control terminal of the sixth TFT 69f is connected to the emission control wire 47, the first conduction terminal Na of the same is connected to the second conduction terminal Nb of the fourth TFT 69d, and the second conduction terminal Nb of the same is connected to a first electrode 91 of the organic EL element 105. The sixth TFT 69f is designed to apply a drive current to the organic EL element 105 in accordance with the selection of the emission control wire 47.

The seventh TFT 69g is a second initialization TFT disposed between the gate wire 43, initialization power-source wire 53 and organic EL element 105. The control terminal of the seventh TFT 69g is connected to the gate wire 43, the first conduction terminal Na of the same is connected to the initialization power-source wire 53, and the second conduction terminal Nb of the same is connected to the first electrode 91 of the organic EL element 105. The seventh TFT 69g is designed to reset electric charges accumulating in the first electrode 91 of the organic EL element 105 in accordance with the selection of the gate wire 43.

The capacitor 73 is disposed between the high-level power-source wire 65, first TFT 69a and fourth TFT 69d and is used for data retention. The first capacitive electrode 49 of the capacitor 73 is connected to the control terminal of the fourth TFT 69d, to the second conduction terminal Nb of the first TFT 69a and to the second conduction terminal Nb of the second TFT 69b. The second capacitive electrode 55 of the capacitor 73 is connected to the high-level power-source wire 65. The capacitor 73 is designed to accumulate electricity at a voltage of the source wire 59 and retain an input voltage resulting from this electric accumulation when the gate wire 43 is selected, to maintain the voltage applied to the control terminal of the fourth TFT 69d when the gate wire 43 is not selected.

The flattening film 39 covers the components in the display region D other than some of the drain electrodes 63 of the sixth TFTs 69f (e.g., the source wires 59, the source electrodes 61, the other part of the drain electrodes 63, the high-level power-source wires 65, and a second frame capacitive electrode 67), to flatten the surface of the TFT layer 17 so as to reduce asperities resulting from the surface shape of the first TFT 69a, second TFT 69b, third TFT 69c, fourth TFT 69d, fifth TFT 69e, sixth TFT 69f and seventh TFT 69g. The flattening film 39 is made of an organic material, such as polyimide resin.

Configuration of Light Emitter Layer

The light emitter layer 19 is disposed on the flattening film 39, as illustrated in FIG. 3. The light emitter layer 19 includes the first electrode 91, an edge cover 95, the organic EL layer 101, and a second electrode 103 all disposed on the flattening film 39 sequentially.

The first electrode 91, the organic EL layer 101, and the second electrode 103 constitute the organic EL element 105. The organic EL element 105 is provided for each sub-pixel 5. That is, the light emitter layer 19 includes a plurality of organic EL elements 105. The organic EL element 105 is an example light emitter. The organic EL element 105 has a top-emission structure for instance.

The first electrode 91 is provided for each sub-pixel 5. Each first electrode 91 is connected to the drain electrode 63 of the sixth TFT 69f of the corresponding sub-pixel 5 via a contact hole 107 bored in the flattening film 39. The first electrodes 91 serve as anodes that inject positive holes (holes) into the organic EL layers 101 and reflect light.

The first electrode 91 is made of a metal material, including silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn).

In some cases, the first electrode 91 may be made of an alloy of, for instance, astatine (At) and astatine oxide (AtO$_2$). Alternatively, the first electrode 91 may be made of a conductive oxide for instance, such as tin oxide (SnO), zinc oxide (ZnO), indium tin oxide (ITO), or indium zinc oxide (IZO).

The first electrode 91 is more preferably made of a material having a large work function in order to improve the efficiency of hole injection into the organic EL layers 101. Furthermore, the first electrode 91 may be composed of a stack of multiple layers made of the above materials.

The edge cover 95 partitions the first electrodes 91 of the sub-pixels 5 adjacent to each other. The edge cover 95 is overall in the form of a lattice and covers the outer edges of the individual first electrodes 91. The edge cover 95 is made of an organic material, such as polyimide resin, acrylic resin, polysiloxane resin, or novolak resin. The edge cover 95 has a surface partly protruding upward to constitute photospacers 97.

The organic EL layer 101 is disposed on each individual first electrode 91. The organic EL layer 101 is an example of a light-emission functioning layer. As illustrated in FIG. 5, the organic EL layer 101 has a hole injection layer 109, a hole transport layer 111, a luminous layer 113, an electron transport layer 115, and an electron injection layer 117 all disposed on the first electrode 91 sequentially.

The hole injection layer 109 is also called an anode buffer layer and is capable of bringing the energy levels of the first electrode 91 and organic EL layer 101 close to each other to improve the efficiency of hole injection from the first electrode 91 to the organic EL layer 101. Examples of the material of the hole injection layer 109 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 111 is capable of moving positive holes to the luminous layer 113 efficiently. Examples of the material of the hole transport layer 111 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The luminous layer 113 is capable of rejoining together positive holes injected from the first electrode 91 and electrons injected from the second electrode 103 upon voltage application through the first electrode 91 and second electrode 103, to thus emit light. The luminous layer 113 is made of a material that differs in accordance with the color of light (e.g., red, green, or blue) emitted from the organic EL element 105 in each individual sub-pixel 5.

Examples of the material of the luminous layer 113 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, and polysilane.

The electron transport layer 115 is capable of moving electrons to the luminous layer 113 efficiently. The electron transport layer 115 is composed of an organic compound, including an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 117 is also called a cathode buffer layer and is capable of bringing the energy levels of the second electrode 103 and organic EL layer 101 close to each other to improve the efficiency of electron injection from the second electrode 103 to the organic EL layer 101. Examples of the material of the electron injection layer 117 include an inorganic alkali compound, such as lithium fluoride (LiF), magnesium fluoride ($MgF_2$), calcium fluoride ($CaF_2$), strontium fluoride ($SrF_2$), or barium fluoride ($BaF_2$), and include an aluminum oxide ($Al_2O_3$) and a strontium oxide (SrO).

The second electrode 103 is shared among the plurality of sub-pixels 5. The second electrode 103 covers the organic EL layers 101 and edge cover 95, and this electrode overlaps the first electrodes 91 with the organic EL layers 101 interposed therebetween. The second electrode 103 is electrically connected to the low-level power-source wire in the frame region F. The second electrode 103 serves as a cathode that injects electron into the organic EL layers 101 and transmits light.

Examples of the material of the second electrode 103 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF).

Alternatively, the second electrode 103 may be made of, for instance, alloy of magnesium (Mg) and copper (Cu), alloy of magnesium (Mg) and silver (Ag), alloy of sodium (Na) and potassium (K), alloy of astatine (At) and astatine oxide ($AtO_2$), alloy of lithium (Li) and aluminum (Al), alloy of lithium (Li), calcium (Ca) and aluminum (Al), or alloy of lithium fluoride (LiF), calcium (Ca) and aluminum (Al).

Alternatively, the second electrode 103 may be made of a conductive oxide, such as tin oxide (SnO), zinc oxide (ZnO), indium tin oxide (ITO), or indium zinc oxide (IZO). The second electrode 103 is more preferably made of a material having a small work function in order to improve the efficiency of electron injection into the organic EL layers 101. Furthermore, the second electrode 103 may be composed of a stack of multiple layers made of the above materials.

Configuration of Sealing Film

The sealing film 21 covers the individual organic EL elements 105 and is capable of protecting the organic EL layers 101 of the individual organic EL elements 105 from moisture and oxygen. The sealing film 21 includes the following: a first inorganic sealing layer 125 covering the second electrode 103; an organic sealing layer 127 disposed on the first inorganic sealing layer 125; and a second inorganic sealing layer 129 disposed on the organic sealing layer 127.

The first inorganic sealing layer 125 and the second inorganic sealing layer 129 are made of an inorganic material, including silicon oxide ($SiO_2$), aluminum oxide ($Al_2O_3$), silicon nitride (SiNx; e.g., such as $Si_3N_4$ or trisilicon tetranitride), and silicon carbonitride (SiCN). Moreover, the organic sealing layer 127 is made of an organic material, such as acrylic resin, polyurea resin, parylene resin, polyimide resin, or polyamide resin.

Figure 6:
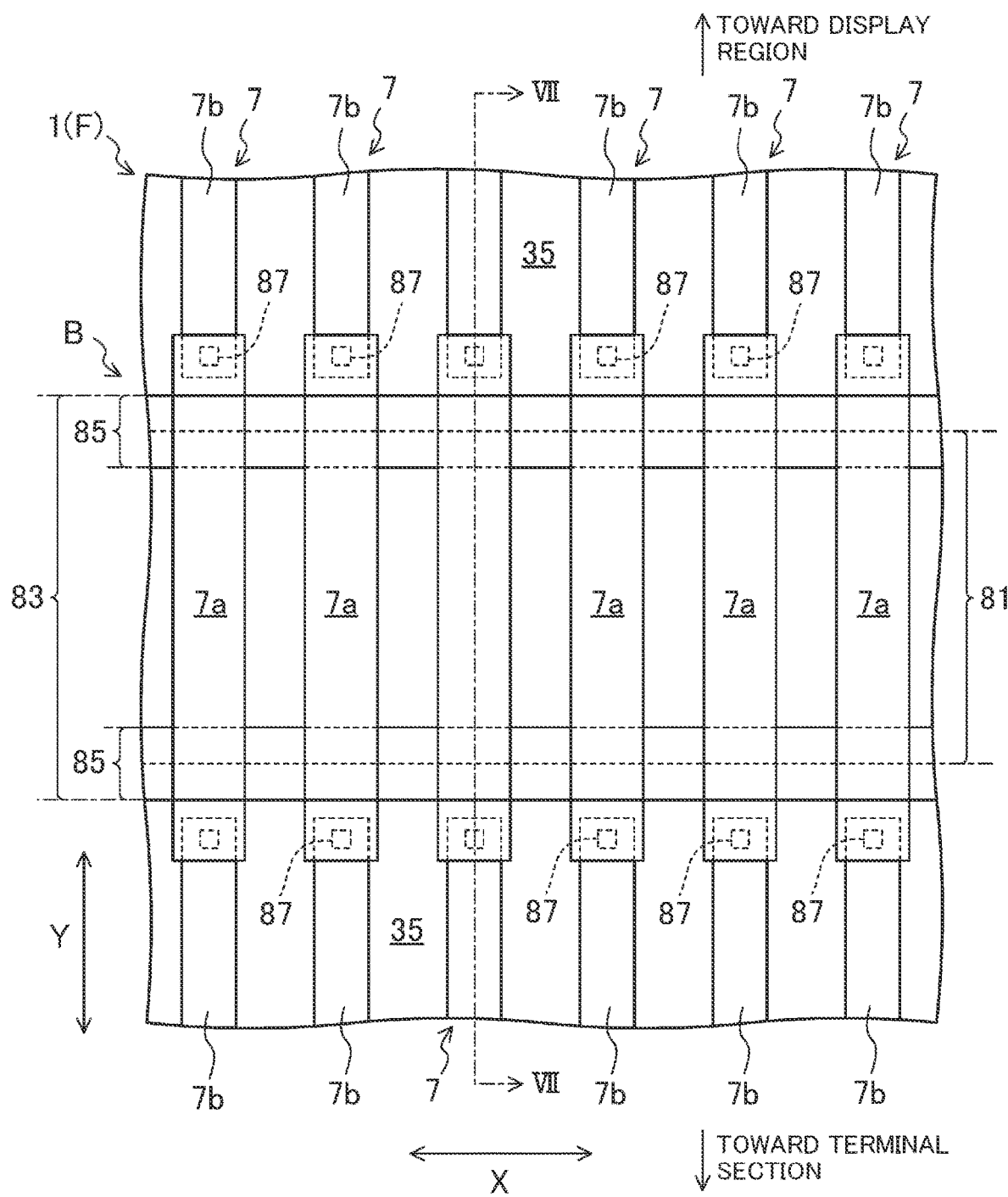
FIG. 6 is a plan view of the configuration of a bend and its surroundings of the organic EL display according to the embodiment.
Figure 7:
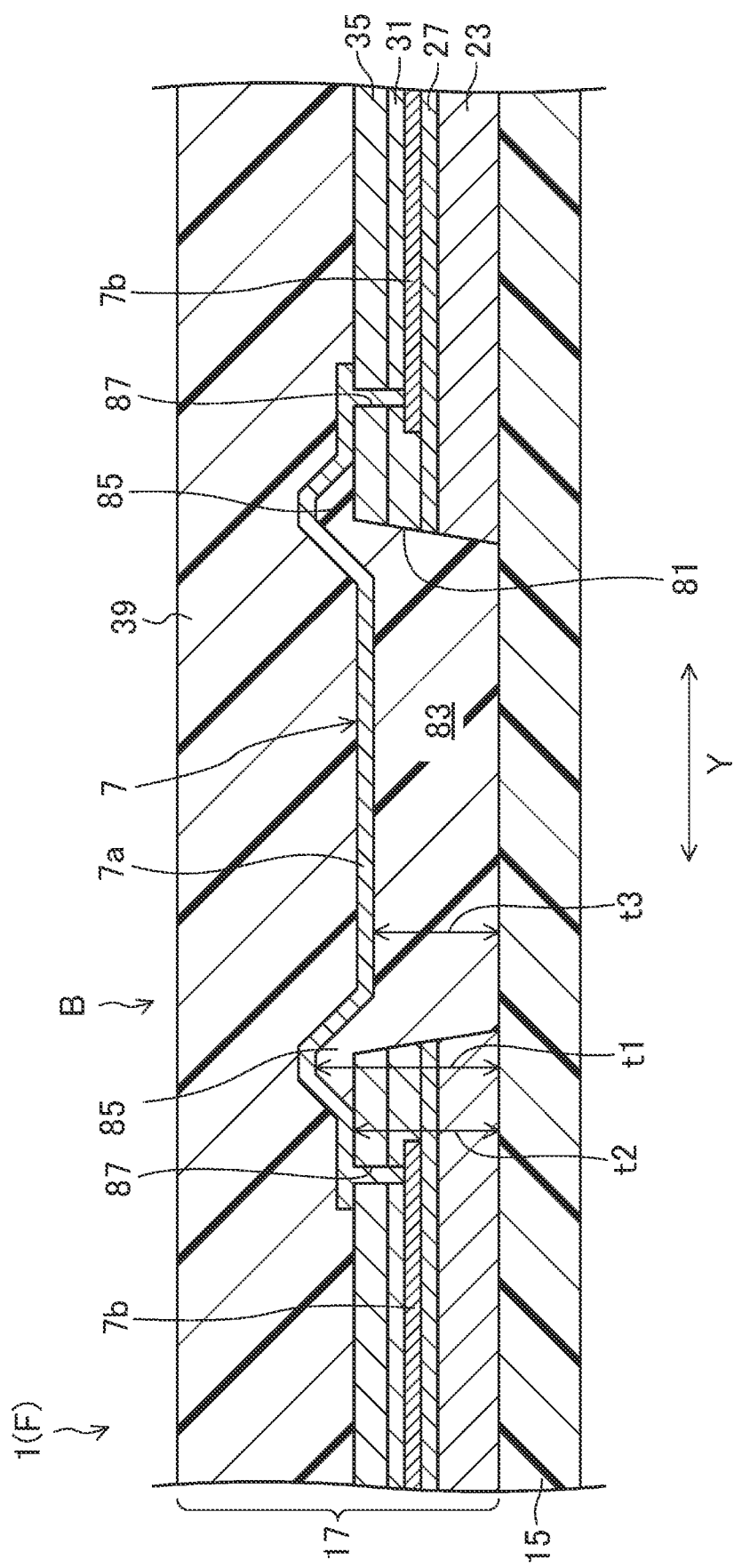
FIG. 7 is a sectional view of the bend and its surroundings of the organic EL display taken along line VII-VII in FIG. 6.

Configuration of Bend and Its Surroundings FIG. 6 is a plan view of the configuration of the bend B and its surroundings of the organic EL display 1. FIG. 7 is a sectional view of the bend B and its surroundings of the organic EL display 1 taken along line VII-VII in FIG. 6.

As illustrated in FIGS. 6 and 7, the inorganic insulating film of the TFT layer 17 at the bend B has a slit 81 extending straight in the first direction X; to be specific, the slit 81 is bored in the base coat film 23, gate insulating film 27, first interlayer insulating film 31 and second interlayer insulating film 35 of the TFT layer 17 at the bend B. The slit 81 exposes the surface of the resin substrate layer 15 from the base coat film 23, gate insulating film 27, first interlayer insulating film 31 and second interlayer insulating film 35.

At the bend B, the slit 81 is filled with a filler layer 83. The filler layer 83 covers both edges in the width direction of the slit 81; that is, this layer covers both the edge of the slit 81 adjacent to the display region D and the edge of the slit 81 adjacent to the terminal section T. The filler layer 83 has a protrusion 85 overlapping each of both edges in the width direction (second direction Y) of the slit 81. Each protrusion 85 extends straight in the first direction X along the slit 81 and is shared among the plurality of routed wires 7. Each protrusion 85 has side surfaces in its width direction (second direction Y) both inclined relatively gently.

The thickness, t1, from the surface of the resin substrate layer 15 to the upper surface of the protrusion 85 is greater than the thickness, t2, from the surface of the resin substrate layer 15 to the upper surface of the second interlayer insulating film 35 that is in contact with the filler layer 83 outside the slit 81. In addition, the thickness t2 from the surface of the resin substrate layer 15 to the upper surface of the second interlayer insulating film 35 that is in contact with the filler layer 83 outside the slit 81 is greater than the thickness, t3, from the surface of the resin substrate layer 15 to the upper surface of the filler layer 83 located inside the slit 81.

The thickness t1 from the surface of the resin substrate layer 15 to the upper surface of the protrusion 85 is about 2.5 μm for instance. The thickness t2 from the surface of the resin substrate layer 15 to the upper surface of the second interlayer insulating film 35 that is in contact with the filler layer 83 outside the slit 81 is about 1.5 μm for instance. The thickness t3 from the surface of the resin substrate layer 15 to the upper surface of the filler layer 83 located inside the slit 81 is about 1.2 μm for instance.

Each of the routed wires 7 is routed, in the second direction Y, from the display region D and then routed over the filler layer 83 to reach the terminal section T. As illustrated in FIG. 7, each routed wire 7 extends over the protrusions 85 of the filler layer 83. The first routed wire 7a, included in the routed wires 7, extends from the slit 81 of the second interlayer insulating film 35 adjacent to the display region D to the slit 81 of the same adjacent to the terminal section T and is located over the filler layer 83. The second routed wire 7b, included in the routed wires 7, is separately disposed closer to the display region D than the slit 81 and closer to the terminal section T than the slit 81.

The second routed wire 7b adjacent to the display region D extends from the display region D to near the slit 81. The second routed wire 7b adjacent to the terminal section T extends from near the slit 81 to the terminal section T. The first routed wire 7a adjacent to the display region D has an end connected to the second routed wire 7b adjacent to the display region D via a contact hole 87, which is bored in the first interlayer insulating film 31 and second interlayer insulating film 35 and is provided for each routed wire 7. The first routed wire 7a adjacent to the terminal section T has an end connected to the second routed wire 7b adjacent to the terminal section T via another contact hole 87, which is bored in the first interlayer insulating film 31 and second interlayer insulating film 35 and is provided for each routed wire 7.

Method for Manufacturing Organic EL Display

A method for manufacturing the organic EL display 1 having the foregoing configuration will be described with reference to FIGS. 8 to 12.

Figure 8:
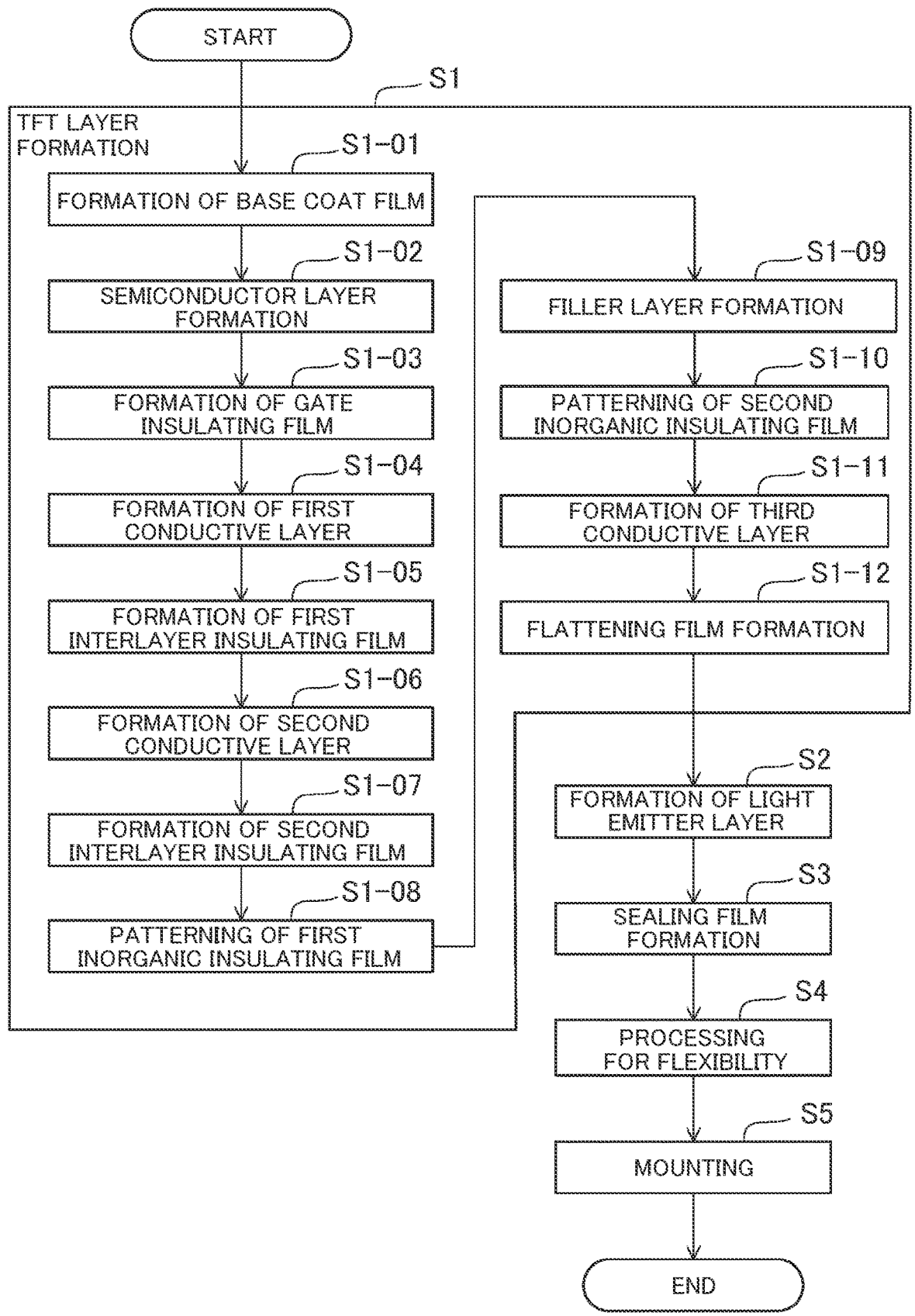
FIG. 8 is a flowchart schematically illustrating a method for manufacturing the organic EL display according to the embodiment.
Figure 9:
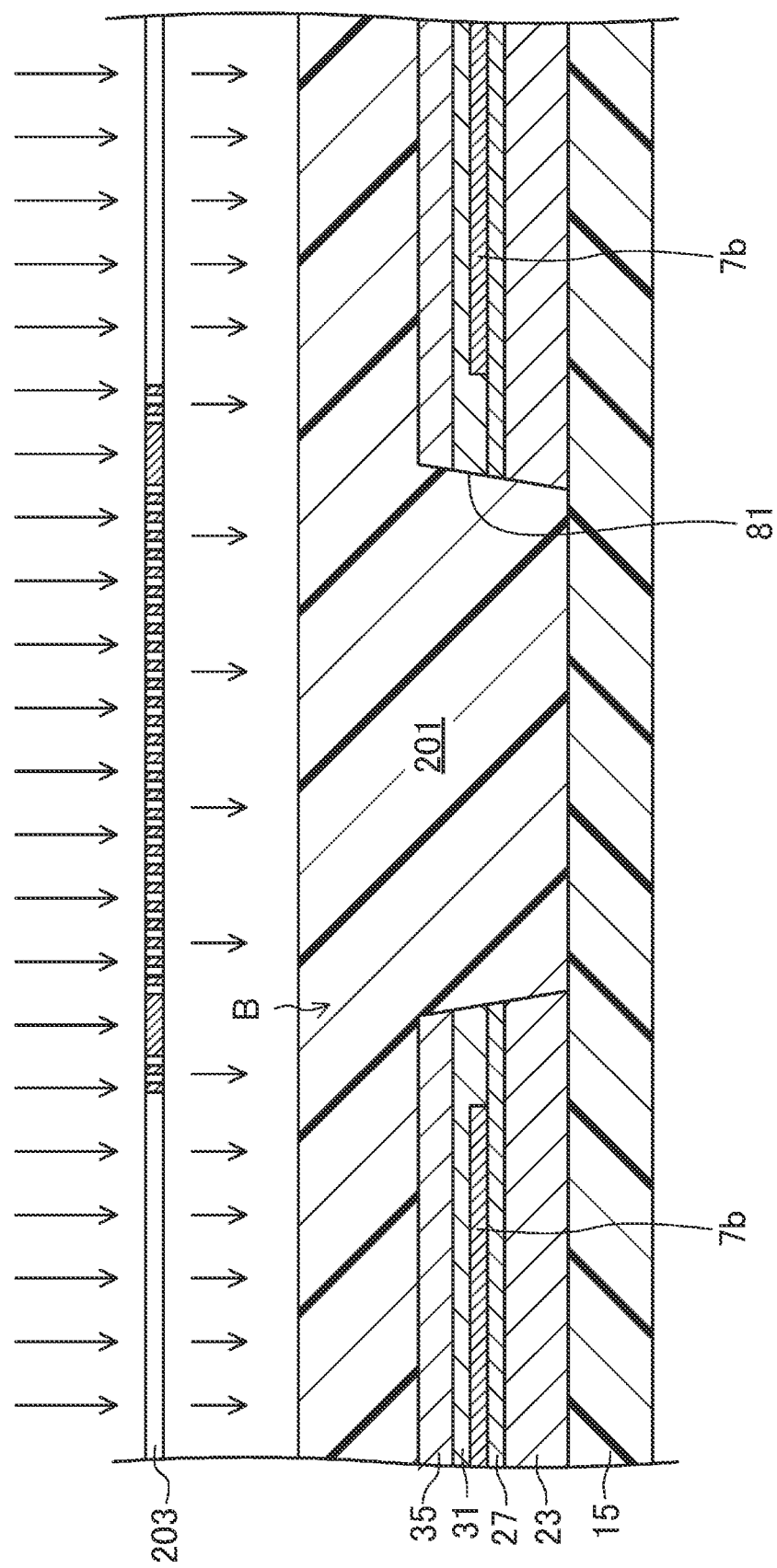
FIG. 9 is a sectional view of main components under light exposure in a step of filler layer formation, which is included in the method for manufacturing the organic EL display according to the embodiment.
Figure 10:
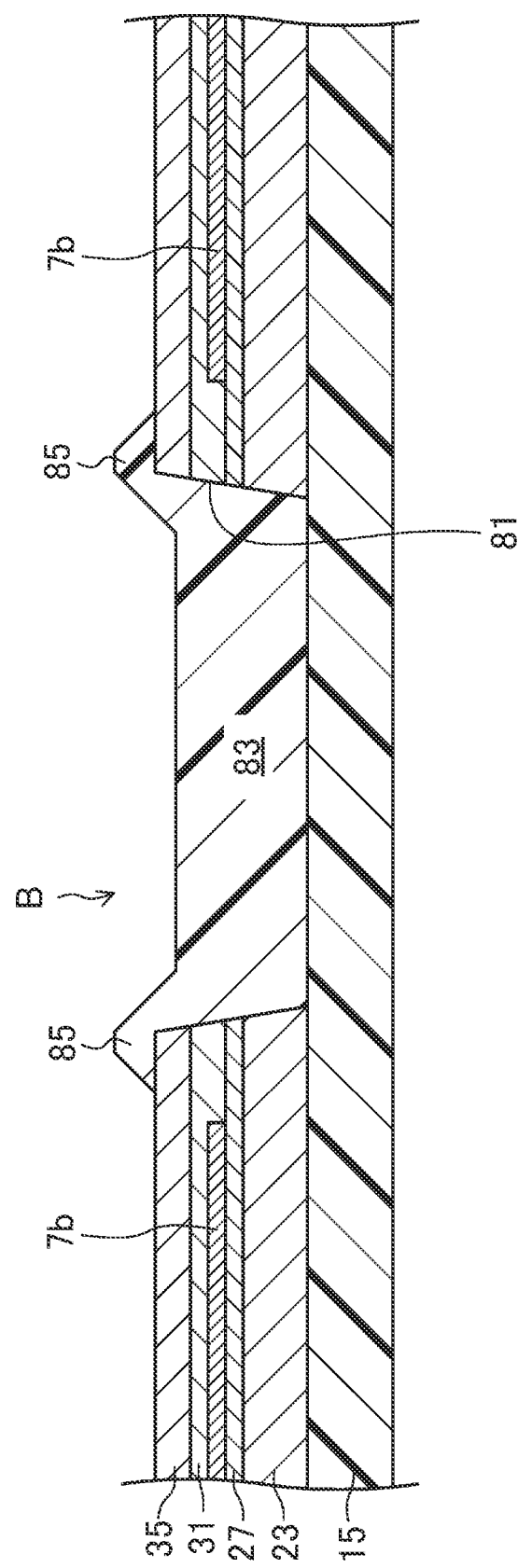
FIG. 10 is a sectional view of the main components after filler layer formation in the step of filler layer formation, which is included in the method for manufacturing the organic EL display according to the embodiment.
Figure 11:
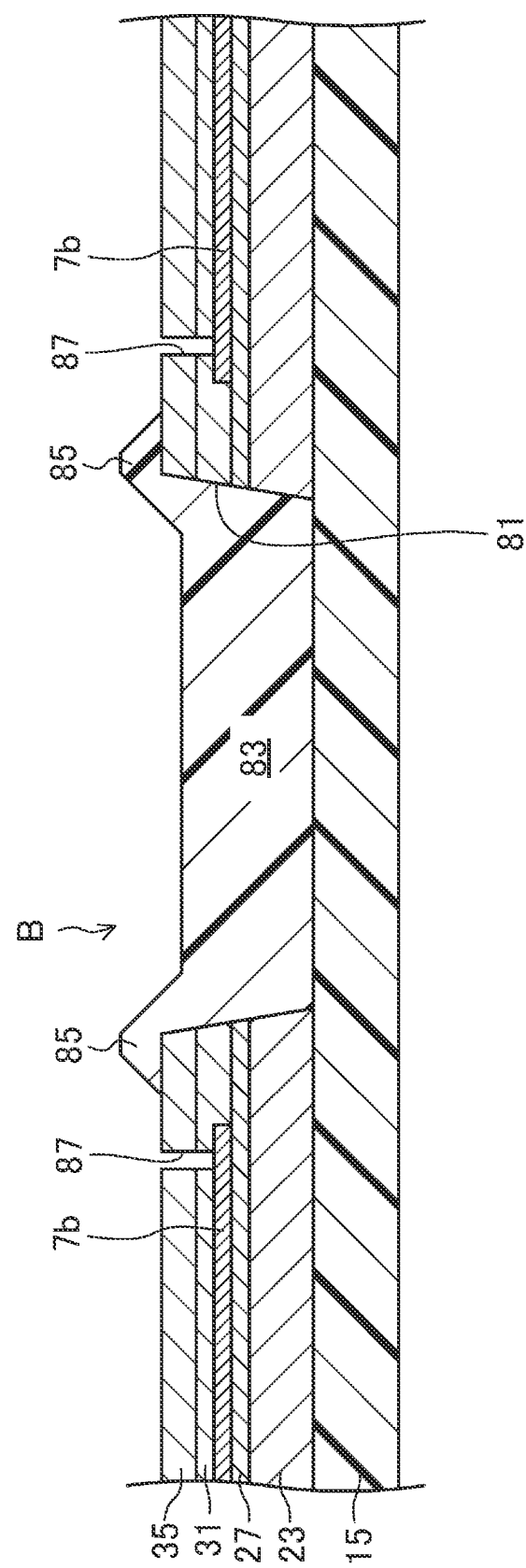
FIG. 11 is a sectional view of the main components after formation of contact holes, which are used for routed wires, in the method for manufacturing the organic EL display according to the embodiment.
Figure 12:
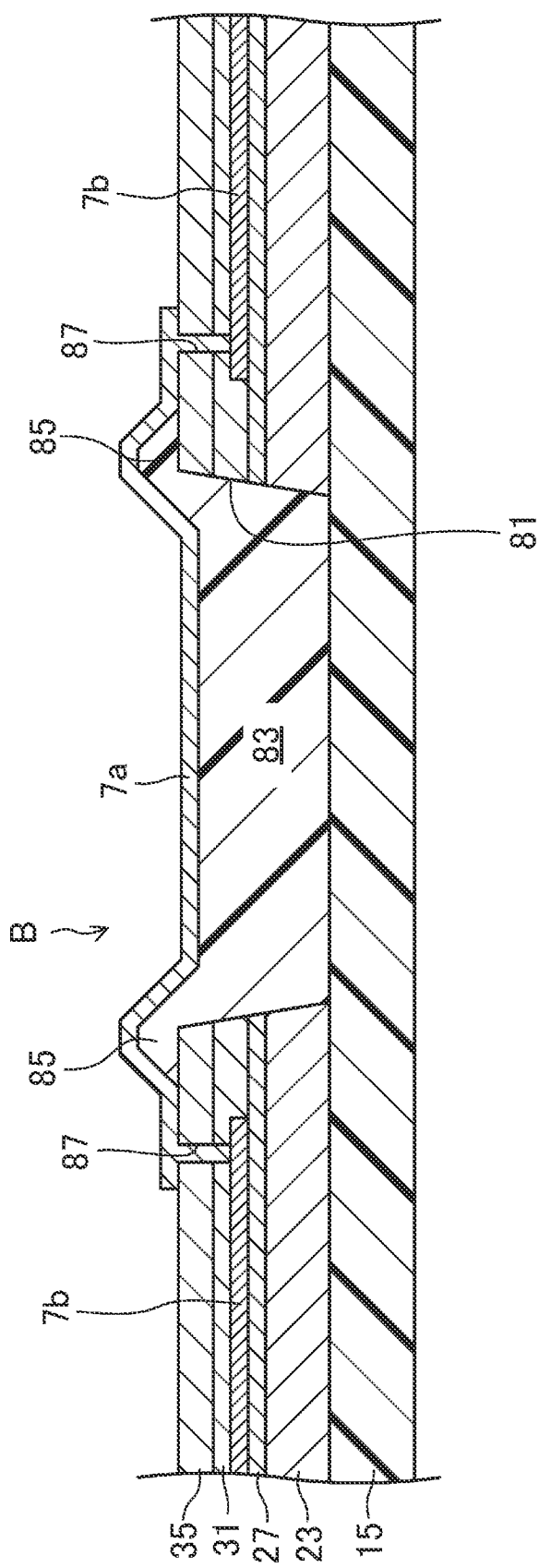
FIG. 12 is a sectional view of the main components after formation of a first routed wire in the method for manufacturing the organic EL display according to the embodiment.

FIG. 8 is a flowchart schematically illustrating the method for manufacturing the organic EL display 1. FIG. 9 is a sectional view of main components under light exposure in Step S1-09, i.e., filler layer formation, which is included in the method for manufacturing the organic EL display 1. FIG. 10 is a sectional view of the main components after formation of the filler layer 83 in Step S1-09 or filler layer formation, which is included in the method for manufacturing the organic EL display 1. FIG. 11 is a sectional view of the main components after formation of the contact holes 87, which are used for the routed wires 7, in the manufacturing of the organic EL display 1. FIG. 12 is a sectional view of the main components after formation of the first routed wire 7a in the manufacturing of the organic EL display 1.

The method for manufacturing the organic EL display 1 includes the following, as illustrated in FIG. 8: Step S1, which is TFT layer formation; Step S2, which is formation of a light emitter layer; Step S3, which is sealing film formation; Step S4, which is processing for flexibility; and Step S5, which is mounting.

TFT Layer Formation

The TFT layer formation or Step S1 includes the following: Step S1-01, which is formation of a base coat film; Step S1-02, which is formation of a semiconductor layer; Step S1-03, which is formation of a gate insulating film; Step S1-04, which is formation of a first conductive layer; Step S1-05, which is formation of a first interlayer insulating film; Step S1-06, which is formation of a second conductive layer; Step S1-07, which is formation of a second interlayer insulating film; Step S1-08, which is patterning of a first inorganic insulating film; Step S1-09, which is filler layer formation; Step S1-10, which is patterning of a second inorganic insulating film; Step S1-11, which is formation of a third conductive layer; and Step S1-12, which is flattening film formation.

In Step S1 (i.e., TFT layer formation), Steps S1-01 (i.e., formation of a base coat film), S1-03 (i.e., formation of a gate insulating film), S1-05 (i.e., formation of a first interlayer insulating film), S1-07 (i.e., formation of a second interlayer insulating film), and S1-08 (i.e., patterning of a first inorganic insulating film) correspond to a step of forming an inorganic insulating film. In addition, Step S1-11 (i.e., formation of a third conductive layer) corresponds to a step of forming a first wire.

The TFT layer formation or Step S1 includes firstly preparing a substrate with the resin substrate layer 15 formed on a glass substrate. The formation of a base coat layer or Step S1-01 includes forming an inorganic insulating monolayer or laminated film onto the resin substrate layer 15 of the prepared substrate through, for instance, chemical vapor deposition (CVD) to thus form the base coat film 23.

Next, the formation of a semiconductor layer or Step S1-02 includes forming a semiconductor film onto the substrate with the base coat film 23 formed thereon through, for instance, CVD, followed by, as needed, crystalizing the semiconductor film or processing the semiconductor film into a low-resistance film, followed by patterning the semiconductor film through photolithography to thus form the semiconductor layer 25.

Next, the formation of a gate insulating film or Step S1-03 includes forming an inorganic insulating monolayer or laminated film onto the substrate with the semiconductor layer 25 formed thereon through, for instance, chemical vapor deposition (CVD) to thus form the gate insulating film 27.

Next, the formation of a first conductive layer or Step S1-04 includes forming a metal monolayer or laminated film onto the substrate with the gate insulating film 27 formed thereon through, for instance, sputtering to thus form a conductive film. The conductive film then undergoes patterning by photolithography to form the first conductive layer 29 (the gate wires 43, gate electrodes 45, emission control wires 47, first capacitive electrodes 49, the second routed wires 7b).

Next, the formation of a first interlayer insulating film or Step S1-05 includes forming an inorganic insulating monolayer or laminated film onto the substrate with the first conductive layer 29 formed thereon through, for instance, CVD to thus form the first interlayer insulating film 31.

Next, the formation a second conductive layer or Step S1-06 includes forming a metal monolayer or laminated film onto the substrate with the first interlayer insulating film 31 formed thereon through, for instance, sputtering to thus form a conductive film. The conductive film then undergoes patterning by photolithography to form the second conductive layer 33 (the initialization power-source wires 53 and second capacitive electrodes 55).

Next, the formation of a second interlayer insulating film or Step S1-07 includes forming an inorganic insulating monolayer or laminated film onto the substrate with the second conductive layer 33 formed thereon through, for instance, CVD to thus form the second interlayer insulating film 35.

Next, the patterning of a first inorganic insulating film or Step S1-08 includes patterning the base coat film 23, gate insulating film 27, first interlayer insulating film 31 and second interlayer insulating film 35 through photolithography to thus form the slit 81. At this time, the gate insulating film 27, first interlayer insulating film 31 and second interlayer insulating film 35 undergo boring to form the contact holes 71, and the second interlayer insulating film 35 undergoes boring to form the contact holes 75.

Next, the filler layer formation or Step S1-09 includes applying a photosensitive resin material onto the substrate with the contact holes 71 and 75 and slit 81 formed therein through a publicly known application method, such as spin coating. As the photosensitive resin material, a positive polyimide photosensitive resin material is used for instance. Subsequently, this applied film, 201, of photosensitive resin material undergoes patterning through pre-baking, light exposure, development and post-baking to thus form the filler layer 83 so as to fill the slit 81 and cover both edges in the width direction of the slit 81.

The light exposure step at this time includes using a graytone mask 203 to distinct the amount of light exposure of the applied film 201 between the second interlayer insulating film 35 covering the individual edges of the slit 81 and the second interlayer insulating film 35 located inside the slit 81, as illustrated in FIG. 9. When the applied film 201 is made of a positive photosensitive resin material, the applied film 201 covering the individual edges of the slit 81 needs to be shielded from light by using the graytone mask 203, to expose the applied film 201 located inside the slit 81 at a smaller amount of light than a portion that does not constitutes the filler layer 83.

Then, the applied film 201 after the light exposure undergoes development to make the applied film 201 covering the individual edges of the slit 81 thicker than the portion located inside the slit 81, followed by forming the protrusions 85 in the filler layer 83 overlapping the individual edges of the slit 81. The next process step is post-baking to form the filler layer 83 having the protrusions 85, as illustrated in FIG. 10. Although the filler layer 83 at this time becomes thin as a result of the baking process, the filler layer 83 has the protrusions 85, which are located on the second interlayer insulating film 35 overlapping the individual edges of the slit 81. This enables the filler layer 83 to cover the individual edges of the slit 81 with certainty even when this overlapping portion becomes thin.

Next, the patterning of a second inorganic insulating film or Step S1-10 includes patterning the first interlayer insulating film 31 and second interlayer insulating film 35 through photolithography to thus form the contact holes 87, which are used for connecting the first routed wire 7a, formed later on, to the second routed wire 7b, as illustrated in FIG. 11. At this time, the second interlayer insulating film 35 undergoes boring as well to form the contact holes 75.

Next, the formation of a third conductive layer or Step S1-11 includes forming a metal monolayer or laminated film onto the substrate with the filler layer 83 formed thereon through, for instance, sputtering to thus form a conductive film. The conductive film then undergoes patterning by photolithography to form the third conductive layer 37 (the source wires 59, source electrodes 61, drain electrodes 63, high-level power-source wires 65, low-level power-source wire, and first routed wires 7a).

At this time, the plurality of first routed wires 7a are formed so as to extend, in the second direction Y, over the protrusion 85 from the display region D and to be routed over the filler layer 83 to reach the terminal section T, as illustrated in FIG. 12. In addition, one of the ends of each first routed wire 7a is brought into connection with the corresponding second routed wire 7b adjacent to the display region D via the contact hole 87, and the other end of each first routed wire 7a is brought into connection with the corresponding second routed wire 7b adjacent to the terminal section T via the contact hole 87.

Next, the flattening film formation or Step S1-12 includes applying a photosensitive resin material onto the substrate with the third conductive layer 37 formed thereon through a publicly known application method, such as spin coating. Subsequently, this applied film of photosensitive resin material undergoes patterning through pre-baking, light exposure, development and post-baking to form the flattening film 39.

As described above, the TFT layer 17 is formed onto the resin substrate layer 15 in the TFT layer formation or Step S1.

Formation of Light Emitter Layer

The formation of a light emitter layer or Step S2 includes forming a conductive oxide layer and a metal layer onto the substrate with the TFT layer 17 formed thereon through, for instance sputtering to thus form a conductive film. The conductive film then undergoes patterning by photolithography to form the first electrodes 91.

The substrate with the first electrodes 91 formed thereon then undergoes application of a photosensitive resin material through a publicly known application method, such as spin coating. This applied film of photosensitive resin material subsequently undergoes patterning through pre-baking, light exposure, development and post-baking to form the edge cover 95.

The substrate with the edge cover 95 formed thereon next undergoes, for instance, vacuum deposition using a film-formation mask, called a fine metal mask (FMM), patternable per sub-pixel, to form subsequently the hole injection layer 109, hole transport layer 111, luminous layer 113, electron transport layer 115 and electron injection layer 117, thus forming the organic EL layer 101 onto the individual first electrodes 91. It is noted that some of the hole injection layer 109, hole transport layer 111, luminous layer 113, electron transport layer 115 and electron injection layer 117 may be formed using a film-formation mask, called a common metal mask (CMM), patternable per display panel.

The substrate with the organic EL layer 101 formed thereon next undergoes, for instance, vacuum deposition using a CMM film-formation mask, to form a metal monolayer or laminated film, thus forming the second electrode 103.

As described above, the light emitter layer 19 is formed onto the TFT layer 17 in the formation of a light emitter layer or Step S2.

Sealing Film Formation

The sealing film formation or Step S3 includes forming an inorganic insulating monolayer or laminated film onto the substrate with the light emitter layer 19 formed thereon through, for instance, CVD with a CMM film-formation mask to thus form the first inorganic sealing layer 125.

The substrate with the first inorganic sealing layer 125 formed thereon next undergoes application of an organic material through, for instance, ink jetting to form the organic sealing layer 127.

The substrate with the organic sealing layer 127 formed thereon then undergoes, for instance, CVD with a CMM film-formation mask, to form an inorganic insulating monolayer or laminated film, thus forming the second inorganic sealing layer 129.

As described above, the sealing film 21, consisting of a stack of the first inorganic sealing layer 125, organic sealing layer 127 and second inorganic sealing layer 129, is formed in the sealing film formation or Step S3.

Processing for Flexibility

The processing for flexibility or Step S4 includes first, attaching a front-surface protective film onto the substrate surface with the sealing film 21 formed thereon. Then, the lower surface of the resin substrate layer 15 undergoes laser light irradiation from the glass substrate to thus remove the glass substrate from the lower surface of the resin substrate layer 15. The lower surface of the resin substrate layer 15 with the glass substrate removed therefrom undergoes attachment of a back-surface protective film.

Mounting

Mounting or Step S5 includes connecting a wiring substrate to the terminal section T of the substrate with the glass substrate removed from the resin substrate layer 15, by using a conductor, such as an anisotropic conductive film (ACF) or an anisotropic conductive paste (ACP), to thus establish electrical conduction between the wiring substrate and wire terminals 13, followed by mounting the wiring substrate as well as external circuits, such as a display control circuit.

The organic EL display 1 according to this embodiment can be manufactured through the foregoing process steps.

The organic EL display 1 according to this embodiment includes the filler layer 83 having the protrusion 85 overlapping each edge in the width direction of the slit 81. The organic EL display 1 also includes the routed wires 7 extending over the protrusion 85. The filler layer 83 can thus cover the edges of the slit 81 with certainty even when the filler layer 83 is thin at a location where the layer covers the edges of the slit 81 of the second interlayer insulating film 35. This can avoid the routed wires 7 from breakage at the bend B.

First Modification of Embodiment

Figure 13:
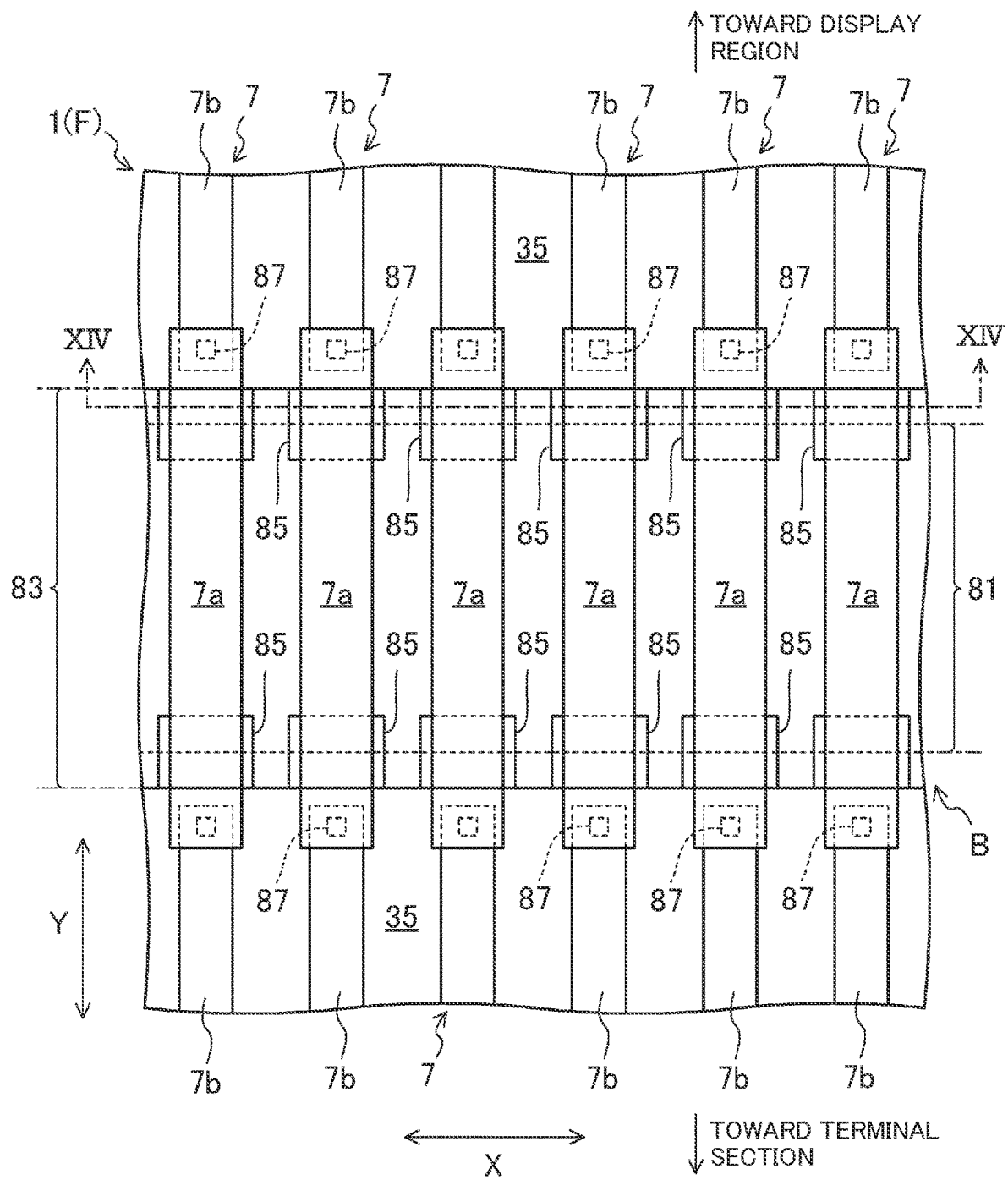
FIG. 13 is a plan view of the configuration of the bend and its surroundings of the organic EL display according to a first modification of the embodiment.
Figure 14:
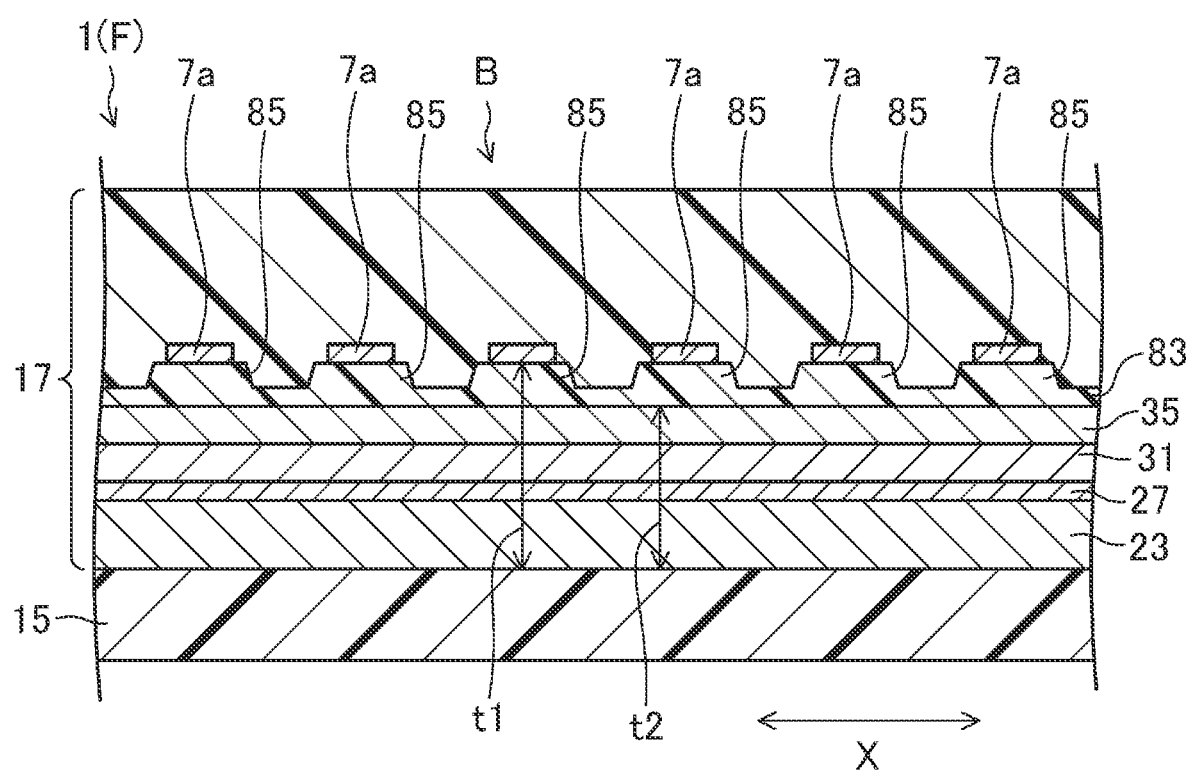
FIG. 14 is a sectional view of the bend and its surroundings of the organic EL display taken along line XIV-XIV in FIG. 13.

FIG. 13 is a plan view of the configuration of the bend B and its surroundings of the organic EL display 1 according to a first modification. FIG. 14 is a sectional view of the bend and its surroundings of the organic EL display 1 taken along line XIV-XIV in FIG. 13.

In the organic EL display 1 according to the first modification, the protrusion 85 of the filler layer 83 is provided for each routed wire 7, as illustrated in FIGS. 13 and 14. The plurality of protrusions 85 are spaced from each other along the slit 81 on both sides in the width direction (second direction Y) of the filler layer 83 and form columns in the first direction X. The individual protrusions 85 on both sides in the width direction of the filler layer 83 correspond one-to-one to the routed wires 7.

The thickness t1 from the surface of the resin substrate layer 15 to the upper surface of the protrusion 85 is greater than the thickness t2 from the surface of the resin substrate layer 15 to the upper surface of the second interlayer insulating film 35 that is in contact with the filler layer 83 outside the slit 81. In addition, the thickness t2 from the surface of the resin substrate layer 15 to the upper surface of the second interlayer insulating film 35 that is in contact with the filler layer 83 outside the slit 81 is greater than the thickness t3 (not shown in FIG. 14; c.f., FIG. 7) from the surface of the resin substrate layer 15 to the upper surface of the filler layer 83 located inside the slit 81. An example of each of the thicknesses t1, t2 and t3 is what has been described in the forgoing embodiment (i.e., t1 is about 2.5 μm, t2 is about 1.5 μm, and t3 is about 1.2 μm).

Second Modification of Embodiment

Figure 15:
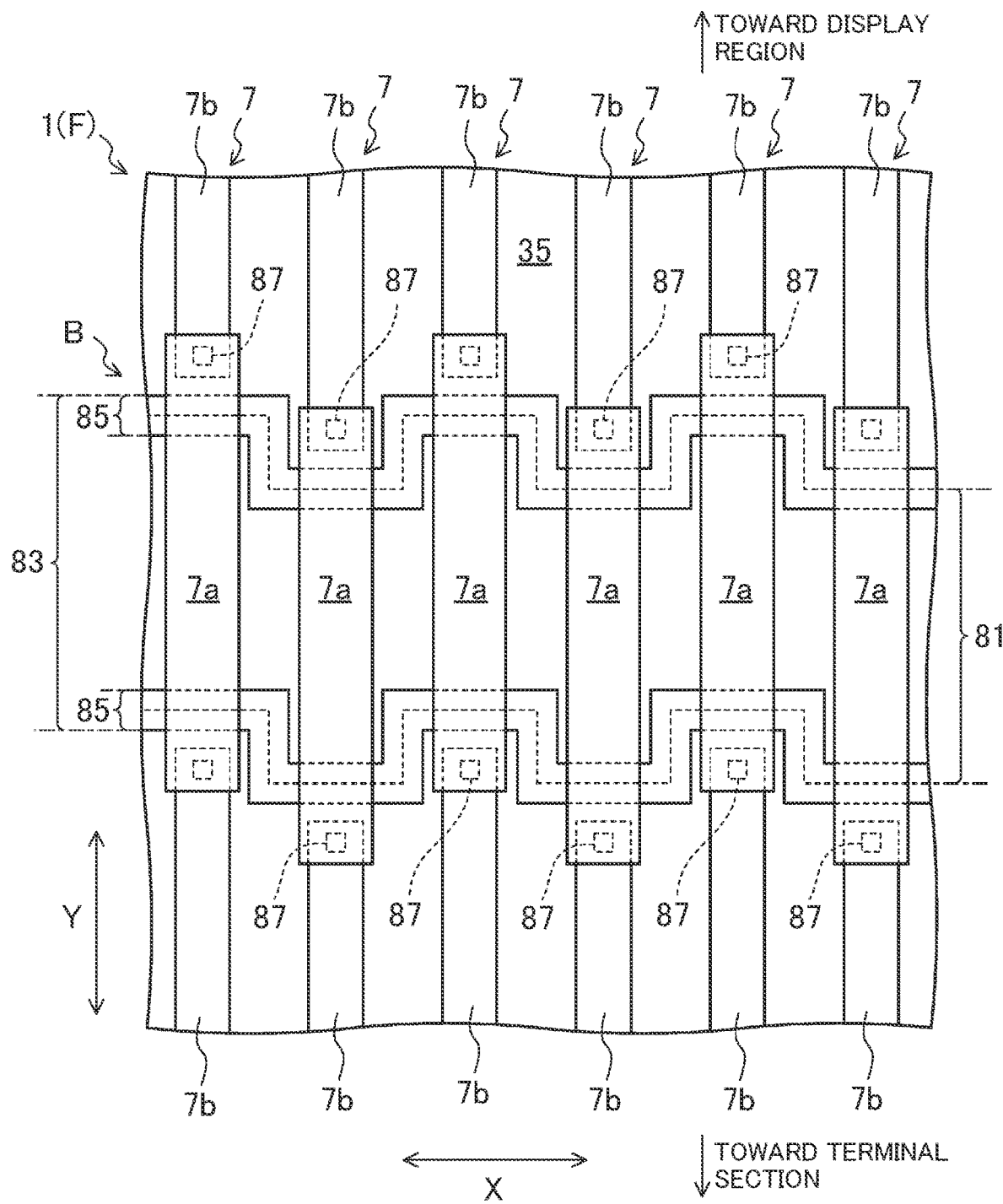
FIG. 15 is a plan view of the configuration of the bend and its surroundings of the organic EL display according to a second modification of the embodiment.

FIG. 15 is a plan view of the configuration of the bend B and its surroundings of the organic EL display 1 according to a second modification.

In the organic EL display 1 according to the second modification, the slit 81 has a curved shape extending in the first direction X while curving alternately to one side and the other side in the second direction Y, as illustrated in FIG. 15. Further, the protrusion 85 of the filler layer 83 has a curved shape extending along the edges of the slit 81 on both sides in the width direction (second direction Y) of the filler layer 83. The curved shape of the slit 81 and the curved shape of the protrusion 85 constitute a dip or bump in the second direction Y at a location corresponding to each of the plurality of routed wires 7.

The protrusion 85 overlapping the edge of the slit 81 adjacent to the display region D and the protrusion 85 overlapping the edge of the slit 81 adjacent to the terminal section T are arranged in such a manner that the dips of the respective curved shapes in the same direction and the bumps of the respective curved shapes in the same direction correspond to the second direction Y. That is, at a location corresponding to each individual routed wire 7, when one of the protrusions 85 has a shape constituting a bump toward the display region D and a dip toward the terminal section T, the other protrusion 85 also has a shape constituting a bump toward the display region D and a dip toward the terminal section T. In addition, at a location corresponding to each individual routed wire 7, when one of the protrusions 85 has a shape constituting a dip toward the display region D and a bump toward the terminal section T, the other protrusion 85 also has a shape constituting a dip toward the display region D and a bump toward the terminal section T.

The contact hole 87 used for connecting the first routed wire 7a to the second routed wire 7b adjacent to the display region D is disposed closer to the display region D than the protrusion 85 overlapping the edge of the slit 81 adjacent to the display region D and is provided for each routed wire 7 so as to be arranged alternately, along the protrusion 85, inside the dip of the curved shape of the protrusion 85 and outside the bump of the curved shape of the protrusion 85. In addition, the contact hole 87 used for connecting the first routed wire 7a to the second routed wire 7b adjacent to the terminal section T is disposed closer to the terminal section T than the protrusion 85 overlapping the edge of the slit 81 adjacent to the terminal section T and is provided for each routed wire 7 so as to be arranged alternately, along the protrusion 85, inside the dip of the curved shape of the protrusion 85 and outside the bump of the curved shape of the protrusion 85.

The foregoing has described a preferred embodiment as an example of the technique of the present disclosure. The technique of the present disclosure is not limited to the foregoing embodiment and is also applicable to an embodiment that has undergone, for instance, modification, replacement, addition, or omission as appropriate. Furthermore, the components described in the foregoing embodiment can be combined to devise a new embodiment. Furthermore, some of the components described in the accompanying drawings and in the detailed description can be non-essential for solving the problem. Thus, these non-essential components, if they are included in the accompanying drawings and detailed description, should not be regarded as essential components.

The foregoing embodiment may be configured in the following manner for instance.

The foregoing has described that the second routed wires 7b are made of the same material and formed in the same layer as the gate wires 43, gate electrodes 45 and other things. However, the technique of the present disclosure is not limited to this configuration. The second routed wires 7b may be made of the same material and formed in the same layer as the initialization power-source wires 53 and second capacitive electrodes 55, and the second routed wires 7b may be included in the second conductive layer 33.

The foregoing has described that the organic EL layer 101 is individually provided for each sub-pixel 5. However, the technique of the present disclosure is not limited to this configuration. The organic EL layer 101 may be shared among the plurality of sub-pixels 5. The organic EL display 1 in this case may include a color filter to perform color tone expression of the individual sub-pixels 5.

The foregoing has described an instance where the sub-pixels 5 of three colors, constituting each pixel 3, are arranged in a stripe manner. However, the technique of the present disclosure is not limited to this configuration. The sub-pixels 5 constituting each pixel 3 may consist of four or more colors. The plurality of sub-pixels 5 constituting each pixel 3 may be arranged in any other manner, such as a PenTile manner.

The foregoing has described that the first to seventh TFTs 69a, 69b, 69c, 69d, 69e, 69f and 69g are top-gate TFTs.

However, the technique of the present disclosure is not limited to this configuration. The first to seventh TFTs 69a, 69b, 69c, 69d, 69e, 69f and 69g may be bottom-gate TFTs. Moreover, each sub-pixel 5 may have eight or more TFTs 69 or six or less TFTs 69.

The forgoing embodiment has described, by way of example, that the organic EL display 1 has the first electrodes 91 serving as anodes and the second electrode 103 serving as a cathode. However, the technique of the present disclosure is not limited to this configuration. The technique of the present disclosure is also applicable to the organic EL display 1 that includes the organic EL layer 101 of inverted stacked structure, specifically, the first electrodes 91 can serve as cathodes, and the second electrode 103 can serve as an anode.

The foregoing embodiment has described, by way of example, that the organic EL layer 101 has a 5-ply stack of the hole injection layer 109, hole transport layer 111, luminous layer 113, electron transport layer 115 and electron injection layer 117. However, the technique of the present disclosure is not limited to this configuration. The organic EL layer 101 may have a 3-ply stack of a hole injection-and-transport layer, a luminous layer and an electron transport-and-injection layer, or the organic EL layer 101 can have any structure.

The forgoing embodiment has described, by way of example, the organic EL display 1 as a display device. However, the technique of the present disclosure is not limited to this configuration. The technique of the present disclosure is also applicable to a display device with a plurality of current-driven light emitters, and for instance to a display device with quantum-dot light-emitting diodes (QLEDs), which are light emitters included in a quantum-dot-containing layer.

REFERENCE SIGNS LIST

B bend
D display region
F frame region
T terminal section
X first direction
Y second direction
1 organic EL display
3 pixel
5 sub-pixel
5b sub-pixel
5g sub-pixel
5r sub-pixel
7 routed wire
7a first routed wire (first wire)
7b second routed wire (second wire)
13 wire terminal
15 resin substrate layer (resin substrate)
17 TFT layer
19 light emitter layer
21 sealing film
23 base coat film
25 semiconductor layer
27 gate insulating film
29 first conductive layer
31 first interlayer insulating film
33 second conductive layer
35 second interlayer insulating film
37 third conductive layer
39 flattening film
43 gate wire (first conductive layer)
45 gate electrode (first conductive layer)
47 emission control wire (first conductive layer)
49 first capacitive electrode (first conductive layer)
53 initialization power-source wire (second conductive layer)
55 second capacitive electrode (second conductive layer)
59 source wire (third conductive layer)
61 source electrode (third conductive layer)
63 drain electrode (third conductive layer)
65 high-level power-source wire (third conductive layer)
69 TFT
69a first TFT
69b second TFT
69c third TFT
69d fourth TFT
69e fifth TFT
69f sixth TFT
69g seventh TFT
71 contact hole
73 capacitor
75 contact hole
77 pixel circuit
81 slit
83 filler layer
85 protrusion
87 contact hole
91 first electrode
95 edge cover
97 photospacer
101 organic EL layer (light-emission functioning layer)
103 second electrode
105 organic EL element (light emitter)
107 contact hole
109 hole injection layer
111 hole transport layer
113 luminous layer
115 electron transport layer
117 electron injection layer
125 first inorganic sealing layer
127 organic sealing layer
129 second inorganic sealing layer
201 applied film
203 graytone mask

The invention claimed is:

1. A display device comprising:
a resin substrate having flexibility;
an inorganic insulating film disposed on the resin substrate;
a first wire disposed on the inorganic insulating film; and
a terminal section and a bend both disposed in a frame region located around a display region, the terminal section being provided for connection with an external circuit, the bend being bent, between the display region and the terminal section, around an axis extending in a first direction, the display region being provided for image display,
the inorganic insulating film having a slit extending in the first direction at the bend,
the bend being provided with a filler layer filling the slit and covering both of edges in a width direction of the slit,
the first wire including a plurality of routed wires routed, in a second direction, from the display region and then routed over the filler layer to reach the terminal section, the second direction intersecting with the first direction,
wherein the filler layer has a protrusion overlapping each of the edges in the width direction of the slit, the plurality of routed wires extend over the protrusion, a thickness from a surface of the resin substrate to an upper surface of the protrusion is greater than a thickness from the surface of the resin substrate to an upper surface of the inorganic insulating film that is in contact with the filler layer outside the slit, the thickness from the surface of the resin substrate to the upper surface of the inorganic insulating film that is in contact with the filler layer outside the slit is greater than a thickness from the surface of the resin substrate to an upper surface of the filler layer located inside the slit, and the protrusions are spaced from each other along the slit.

2. The display device according to claim 1, wherein the protrusion is provided for each of the plurality of routed wires.

3. The display device according to claim 1, wherein the slit has a curved shape extending in the first direction while curving alternately to one side and another side in the second direction, and the protrusion has a curved shape extending along each of the edges of the slit.

4. The display device according to claim 3, wherein the curved shape of the slit and the curved shape of the protrusion constitute a dip or a bump in the second direction at a location corresponding to each of the plurality of routed wires.

5. The display device according to claim 4, wherein the protrusion overlapping one of the edges of the slit adjacent to the display region and the protrusion overlapping the other of the edges of the slit adjacent to the terminal section are arranged in such a manner that the dips of the respective curved shapes in an identical direction and the bumps of the respective curved shapes in an identical direction correspond to the second direction.

6. The display device according to claim 5, further comprising a second wire disposed on the resin substrate and located in a lower position than the inorganic insulating film, wherein the second wire includes a second routed wire that constitutes a part of each of the plurality of routed wires at a location closer to the display region than the slit and at a location closer to the terminal section than the slit, the plurality of routed wires included in the first wire comprise a first routed wire that is connected, via contact holes, to the second routed wire at the location closer to the display region than the slit and at the location closer to the terminal section than the slit, the contact holes being bored in the inorganic insulating film and being provided for each of the plurality of routed wires, one of the contact holes closer to the display region than the slit is disposed closer to the display region than the protrusion overlapping the edge of the slit adjacent to the display region and is provided for each of the plurality of routed wires so as to be arranged alternately, along the protrusion, inside the dip of the curved shape of the protrusion and outside the bump of the curved shape of the protrusion, and another one of the contact holes closer to the terminal section than the slit is disposed closer to the terminal section than the protrusion overlapping the edge of the slit adjacent to the terminal section and is provided for each of the plurality of routed wires so as to be arranged alternately, along the protrusion, inside the dip of the curved shape of the protrusion and outside the bump of the curved shape of the protrusion.

7. A method for manufacturing a display device, the display device including a terminal section and a bend both disposed in a frame region located around a display region, the terminal section being provided for connection with an external circuit, the bend being bent, between the display region and the terminal section, around an axis extending in a first direction, the display region being provided for image display, the method comprising the steps of:

forming an inorganic insulating film onto a resin substrate having flexibility; and forming a first wire onto the inorganic insulating film, the step of forming the inorganic insulating film including forming, at the bend, a slit extending in the first direction, the method further comprising a step of forming a filler layer in such a manner that the filler layer fills the slit and covers both of edges in a width direction of the slit, by applying a photosensitive resin to form a resin layer, followed by patterning the resin layer through light exposure with a graytone mask, the step of forming the filler layer being performed after the step of forming the inorganic insulating film and before the step of forming the first wire, the filler layer having a protrusion overlapping each of the edges in the width direction of the slit, the step of forming the first wire including forming a plurality of routed wires extending, in a second direction, over the protrusion from the display region and routed over the filler layer to reach the terminal section, the second direction intersecting with the first direction.

8. A display device comprising:

a resin substrate having flexibility;

an inorganic insulating film disposed on the resin substrate;

a first wire disposed on the inorganic insulating film; and a terminal section and a bend both disposed in a frame region located around a display region, the terminal section being provided for connection with an external circuit, the bend being bent, between the display region and the terminal section, around an axis extending in a first direction, the display region being provided for image display, the inorganic insulating film having a slit extending in the first direction at the bend, the bend being provided with a filler layer filling the slit and covering both of edges in a width direction of the slit, the first wire including a plurality of routed wires routed, in a second direction, from the display region and then routed over the filler layer to reach the terminal section, the second direction intersecting with the first direction, wherein the filler layer has a protrusion overlapping each of the edges in the width direction of the slit, the plurality of routed wires extend over the protrusion, a thickness from a surface of the resin substrate to an upper surface of the protrusion is greater than a thickness from the surface of the resin substrate to an upper surface of the inorganic insulating film that is in contact with the filler layer outside the slit, the thickness from the surface of the resin substrate to the upper surface of the inorganic insulating film that is in contact with the filler layer outside the slit is greater than a thickness from the surface of the resin substrate to an upper surface of the filler layer located inside the slit, the slit has a curved shape extending in the first direction while curving alternately to one side and another side in the second direction, the protrusion has a curved shape extending along each of the edges of the slit, the curved shape of the slit and the curved shape of the protrusion constitute a dip or a bump in the second direction at a location corresponding to each of the plurality of routed wires, and the protrusion overlapping one of the edges of the slit adjacent to the display region and the protrusion overlapping the other of the edges of the slit adjacent to the terminal section are arranged in such a manner that the dips of the respective curved shapes in an identical direction and the bumps of the respective curved shapes in an identical direction correspond to the second direction.

9. The display device according to claim 8, wherein the protrusion extends in the first direction along the slit and is shared among the plurality of routed wires.

10. The display device according to claim 8, further comprising
a second wire disposed on the resin substrate and located in a lower position than the inorganic insulating film,
wherein the second wire includes a second routed wire that constitutes a part of each of the plurality of routed wires at a location closer to the display region than the slit and at a location closer to the terminal section than the slit, the plurality of routed wires included in the first wire comprise a first routed wire that is connected, via contact holes, to the second routed wire at the location closer to the display region than the slit and at the location closer to the terminal section than the slit, the contact holes being bored in the inorganic insulating film and being provided for each of the plurality of routed wires, one of the contact holes closer to the display region than the slit is disposed closer to the display region than the protrusion overlapping the edge of the slit adjacent to the display region and is provided for each of the plurality of routed wires so as to be arranged alternately, along the protrusion, inside the dip of the curved shape of the protrusion and outside the bump of the curved shape of the protrusion, and another one of the contact holes closer to the terminal section than the slit is disposed closer to the terminal section than the protrusion overlapping the edge of the slit adjacent to the terminal section and is provided for each of the plurality of routed wires so as to be arranged alternately, along the protrusion, inside the dip of the curved shape of the protrusion and outside the bump of the curved shape of the protrusion.

* * * * *